United States Patent
Takada et al.

(10) Patent No.: US 12,316,989 B2
(45) Date of Patent: May 27, 2025

(54) DRIVING METHOD FOR AD CONVERSION CIRCUIT, AD CONVERSION CIRCUIT, PHOTOELECTRIC CONVERSION DEVICE, AND APPARATUS

(71) Applicant: CANON KABUSHIKI KAISHA, Tokyo (JP)

(72) Inventors: Hideaki Takada, Kanagawa (JP); Hiroaki Kameyama, Kanagawa (JP); Masanori Ogura, Tokyo (JP); Makiko Saito, Tokyo (JP); Takuya Hara, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 206 days.

(21) Appl. No.: 17/728,779

(22) Filed: Apr. 25, 2022

(65) Prior Publication Data

US 2022/0353448 A1    Nov. 3, 2022

(30) Foreign Application Priority Data

Apr. 28, 2021    (JP) .................................. 2021-076754

(51) Int. Cl.
*H04N 25/75*    (2023.01)
*H04N 25/60*    (2023.01)
(Continued)

(52) U.S. Cl.
CPC ............. *H04N 25/75* (2023.01); *H04N 25/60* (2023.01); *H04N 25/616* (2023.01); *H04N 25/78* (2023.01); *H04N 25/79* (2023.01)

(58) Field of Classification Search
CPC ........ H04N 25/60; H04N 25/75; H04N 25/78; H04N 25/79; H04N 25/616
See application file for complete search history.

(56) References Cited

U.S. PATENT DOCUMENTS

2006/0284999 A1*    12/2006    Muramatsu ............ H04N 25/78
                                                                   348/E3.018
2014/0036120 A1     2/2014    Hagihara
(Continued)

FOREIGN PATENT DOCUMENTS

JP    2005323331 A    11/2005
JP    2011024109 A    2/2011
(Continued)

OTHER PUBLICATIONS

Solid-State Image Sensing Device, and AD Conversion Method and Image Sensing Unit Thereof (Year: 2011).*

*Primary Examiner* — Twyler L Haskins
*Assistant Examiner* — Surafel Yilmakassaye
(74) *Attorney, Agent, or Firm* — Canon U.S.A., Inc., IP Division

(57) ABSTRACT

A plurality of comparison circuits each including a first terminal for inputting a first analog signal and a second analog signal and a second terminal connected to a wiring for transmission of a ramp signal A first operation changes an electric potential of the wiring from a predetermined electric potential to a first electric potential to cause at least one of the plurality of comparison circuits to retain a first offset. A second operation, after the first operation, converts the first analog signal into a digital signal. A third operation, after the second operation, changes the electric potential of the wiring to an electric potential included in a range of from the predetermined electric potential to the first electric potential. A fourth operation, after the third operation, converts the second analog signal into a digital signal.

25 Claims, 13 Drawing Sheets

(51) Int. Cl.
*H04N 25/616* (2023.01)
*H04N 25/78* (2023.01)
*H04N 25/79* (2023.01)

(56) References Cited

U.S. PATENT DOCUMENTS

2020/0389609 A1* 12/2020 Komai ................... H04N 25/46
2021/0112211 A1* 4/2021 Kumagai ............... H04N 25/57

FOREIGN PATENT DOCUMENTS

| JP | 4720310 B2 * | 7/2011 |
| JP | 2014033363 A | 2/2014 |
| JP | 2014096670 A | 5/2014 |
| JP | 2021064859 A | 4/2021 |

* cited by examiner

DRIVING METHOD FOR AD CONVERSION CIRCUIT, AD CONVERSION CIRCUIT, PHOTOELECTRIC CONVERSION DEVICE, AND APPARATUS

BACKGROUND

Field

Aspects of the present disclosure generally relate to a driving method for an analog-to-digital (AD) conversion circuit, an AD conversion circuit, a photoelectric conversion device, and an apparatus.

Description of the Related Art

Japanese Patent Application Laid-Open No. 2014-096670 discusses a configuration equipped with a plurality of AD conversion circuits each of which includes a comparator. In this discussed configuration, the comparators are provided with respective different offsets in such a manner that timing at which outputs of comparators of some AD conversion circuits change and timing at which outputs of comparators of the other AD conversion circuits change differ from each other.

In an operation discussed in Japanese Patent Application Laid-Open No. 2014-096670, after an operation of imparting an offset is performed, the electric potential of a ramp signal is reset to a starting level of analog-to-digital (AD) conversion of a noise signal. On the other hand, in AD conversion of a light signal, the electric potential of a ramp signal is reset from the level of ending of AD conversion of a noise signal to the starting level. Thus, an electric potential obtained before resetting to a starting potential of AD conversion of a noise signal is performed and an electric potential obtained before resetting to a starting potential of AD conversion of a light signal is performed are different from each other. As a result, the ramp starting potential of AD conversion of a noise signal and the ramp starting potential of AD conversion of a light signal differ from each other in some cases. This results in a decrease in AD conversion accuracy.

SUMMARY

According to an aspect of the present disclosure, a driving method for an analog-to-digital (AD) conversion circuit includes first, second, third, and fourth operations. The AD conversion circuit includes a plurality of comparison circuits each including a first terminal to which a plurality of analog signals is input and a second terminal connected to a wiring through which a ramp signal is transmitted. The plurality of analog signals includes a first analog signal and a second analog signal. The first operation changes an electric potential of the wiring from a predetermined electric potential to a first electric potential to cause some comparison circuits of the plurality of comparison circuits to retain a first offset. After the first operation, the second operation converts the first analog signal into a digital signal. After the second operation, the third operation changes the electric potential of the wiring to an electric potential included in a range of from the predetermined electric potential to the first electric potential. After the third operation, the fourth operation converts the second analog signal into a digital signal.

According to another aspect of the present disclosure, an analog-to-digital (AD) conversion circuit includes a plurality of comparison circuits and a control circuit. Each of the plurality of comparison circuits includes a first terminal to which a plurality of analog signals is input and a second terminal connected to a wiring through which a ramp signal is transmitted. The plurality of analog signals includes a first analog signal and a second analog signal. The control circuit controls a first operation, a second operation, a third operation, and a fourth operation. The first operation changes an electric potential of the wiring from a predetermined electric potential to a first electric potential to cause some comparison circuits of the plurality of comparison circuits to retain a first offset. The second operation, after the first operation, converts the first analog signal into a digital signal. The third operation, after the second operation, changes the electric potential of the wiring to an electric potential included in a range of from the predetermined electric potential to the first electric potential. The fourth operation, after the third operation, converts the second analog signal into a digital signal.

Further features of the present disclosure will become apparent from the following description of exemplary embodiments with reference to the attached drawings.

DESCRIPTION OF THE EMBODIMENTS

Figure 1:
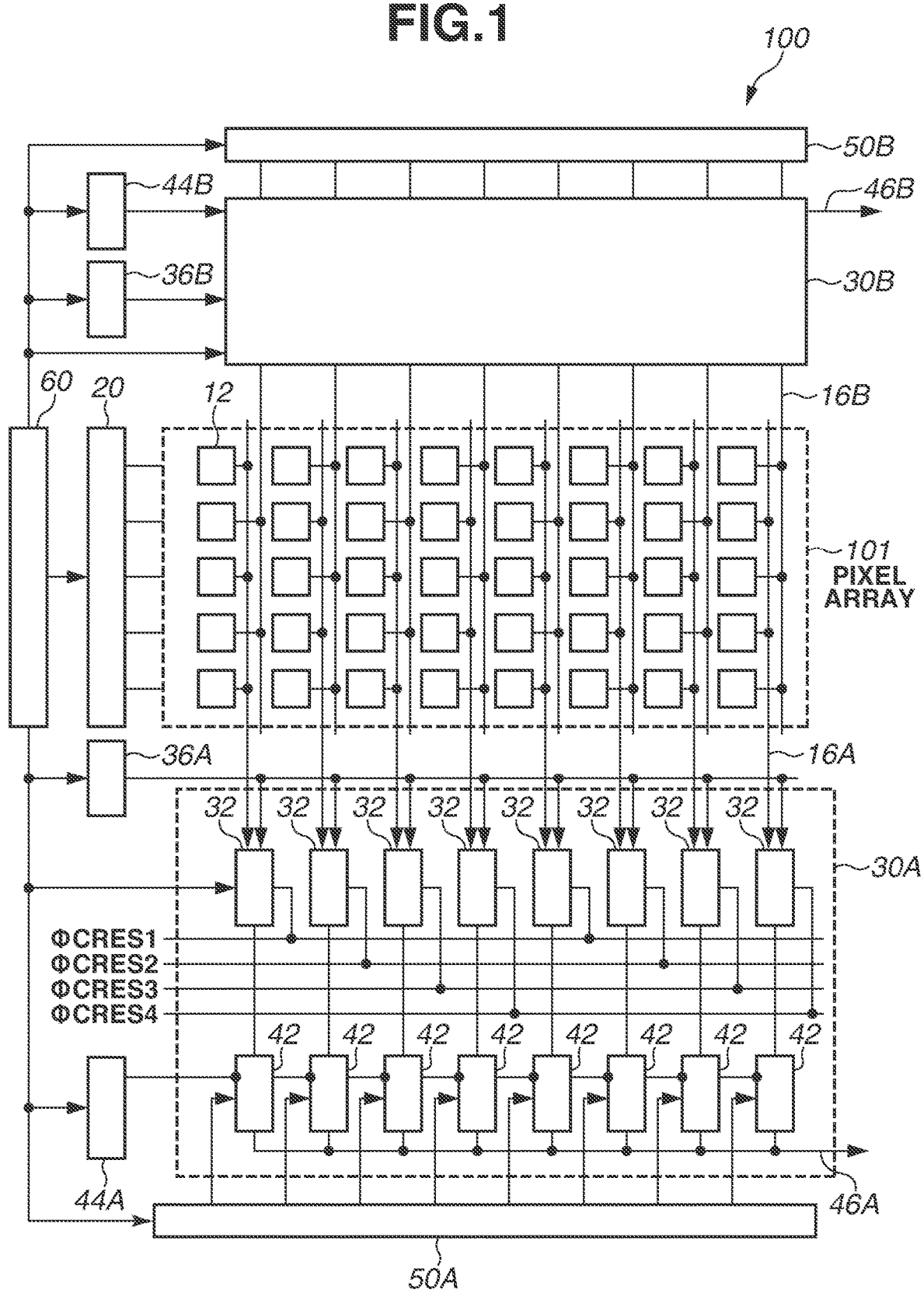
FIG. 1 is a diagram illustrating a configuration of a photoelectric conversion device in a first exemplary embodiment.

The following disclosure relates to a technique to prevent or reduce a decrease in AD conversion accuracy in the case of performing AD conversion of each of a plurality of analog signals.

Various exemplary embodiments, features, and aspects of the disclosure will be described in detail below with reference to the drawings.

While the following exemplary embodiments are described with a focus on an AD conversion circuit which is mounted in a photoelectric conversion device, the present disclosure is not limited to such exemplary embodiments, but can also be applied to an AD conversion circuit which converts an analog signal into a digital signal.

Moreover, an example of a photoelectric conversion device is described with a focus on an imaging device. However, each exemplary embodiment is not limited to an imaging device, but can also be applied to another example of a photoelectric conversion device. For example, each exemplary embodiment can also be applied to a distance measuring device (a device for, for example, focus detection or distance measurement using time of flight (TOF)) or a light metering device (a device for, for example, metering the amount of incident light).

Furthermore, the conductivity type of a transistor described in the following exemplary embodiments is merely an example, and is not limited to only the conductivity type described in each exemplary embodiment. With regard to the conductivity type described in each exemplary embodiment, the conductivity type can be changed as appropriate, and, in association with this change, the electric potentials of the gate, source, and drain of a transistor can be changed as appropriate.

For example, with regard to a transistor which is configured to operate as a switch, the low level and high level of the electric potential which is supplied to the gate can be reversed with respect to the ones described in each exemplary embodiment in association with a change of the conductivity type. Moreover, the conductivity type of a semiconductor region described in the following exemplary embodiments is merely an example, and is not limited to only the conductivity type described in each exemplary embodiment. With regard to the conductivity type described in each exemplary embodiment, the conductivity type can be changed as appropriate, and, in association with this change, the conductivity type of a semiconductor region can be changed as appropriate.

Moreover, in the following exemplary embodiments, there is a case where connection between circuit elements is mentioned. In this case, even if another element intervenes between elements of interest, unless otherwise described, the elements of interest are treated as being connected to each other. For example, suppose that an element A is connected to one node of a capacitive element C, which has a plurality of nodes, and an element B is connected to the other node of the capacitive element C. Even in such a case, unless otherwise described, the element A and the element B are treated as being connected to each other.

An outline configuration of a photoelectric conversion device according to a first exemplary embodiment is described with reference to FIG. 1. FIG. 1 is a block diagram illustrating an outline configuration of the photoelectric conversion device in the first exemplary embodiment.

The photoelectric conversion device 100 in the first exemplary embodiment includes, as illustrated in FIG. 1, a pixel array 101, a vertical scanning circuit 20, AD conversion circuit portions 30A and 30B, horizontal scanning circuits 50A and 50B, and a timing generation circuit 60. Moreover, the photoelectric conversion device 100 in the first exemplary embodiment further includes reference signal output circuits (output circuits) 36A and 36B and counters 44A and 44B. The AD conversion circuit portion 30A, the reference signal output circuit 36A, the counter 44A, and the horizontal scanning circuit 50A constitute a set of readout circuit portions. The AD conversion circuit portion 30B, the reference signal output circuit 36B, the counter 44B, and the horizontal scanning circuit 50B constitute another set of readout circuit portions. The pixel array 101 is arranged between such two sets of readout circuit portions.

The pixel array 101 includes a plurality of pixels 12 arranged in a matrix fashion over a plurality of rows and a plurality of columns. Each pixel 12 includes a photoelectric conversion configured with a photoelectric conversion element such as a photodiode, and outputs a pixel signal corresponding to the amount of incident light. The number of rows and the number of columns of pixels arranged in the pixel array 101 are not specifically limited. Moreover, in the pixel array 101, in addition to effective pixels, each of which outputs a pixel signal corresponding to the amount of incident light, for example, optical black pixels, in each of which a photoelectric conversion portion is shielded from light, and dummy pixels, each of which does not output a signal, can be arranged.

Each pixel 12 arranged in the pixel array 101 includes a color filter, which has a predetermined spectral sensitivity characteristic.

In a Bayer array, a row in which a red (R) pixel and a green (G) pixel are arranged alternately one by one and a row in which a G pixel and a blue (B) pixel are arranged alternately one by one are arranged alternately one by one.

In each row of the pixel array 101, a control line, which extends in a first direction (a horizontal direction in FIG. 1), is arranged. Each control line is connected to the respective pixels 12 arranged in the first direction, and serves a signal line in common for the respective pixels 12. The first direction, in which the control line extends, is in some cases referred to as a "row direction" or a "horizontal direction". The control line is connected to the vertical scanning circuit 20.

In each column of the pixel array 101, an output line 16A and an output line 16B, which extend in a second direction intersecting with the first direction (a vertical direction in FIG. 1), are arranged. A plurality of pixels 12 which constitutes the pixel array 101 is divided into pixels 12 connected to the output line 16A and pixels 12 connected to the output line 16B. With regard to a configuration example illustrated in FIG. 1, in each row and each column of the pixel array 101, a pixel 12 connected to the output line 16A and a pixel 12 connected to the output line 16B are arranged alternately one by one.

Specifically, each output line 16A is connected to R pixels or Gb pixels in the pixels 12 arranged side by side in the second direction and serves as a signal line in common for these pixels 12. Each output line 16B is connected to Gr pixels or B pixels in the pixels 12 arranged side by side in the second direction and serves as a signal line in common for these pixels 12. The second direction, in which the output lines 16A and 16B extend, is in some cases referred to as a "column direction" or a "vertical direction". The output line 16A is connected to the AD conversion circuit portion 30A. Moreover, the output line 16B is connected to the AD conversion circuit portion 30B.

The vertical scanning circuit 20 is a control circuit portion which supplies a control signal for driving a readout circuit included in the pixel 12 when reading out a signal from the pixel 12 to the pixel 12 via the control line provided in each row of the pixel array 101. The vertical scanning circuit 20 can be configured with a shift register or an address decoder.

The vertical scanning circuit 20 drives the pixels 12 of the pixel array 101 on a row by row basis by a control signal which the vertical scanning circuit 20 supplies via the control line. Pixel signals in each column read out from the pixels 12 on a row by row basis are input to the AD conversion circuit portion 30A via the output line 16A, or are input to the AD conversion circuit portion 30B via the output line 16B.

Each of the reference signal output circuits 36A and 36B is a circuit which generates a reference signal for use in AD conversion, for example, a ramp signal. The ramp signal is a signal the level of which gradually varies (increases or decreases) from a predetermined value as time proceeds.

The AD conversion circuit portion 30A includes a plurality of comparison circuits 32 and a plurality of memories or memory circuits 42, which are provided in association with the respective columns of the pixel array 101. The comparison circuit 32 and the memory 42 arranged in each column constitute a column AD conversion circuit portion. To respective input terminals of the comparison circuit 32 in each column, the output line 16A in the corresponding column and the reference signal output circuit 36A are connected. The comparison circuit 31 has two input terminals: a first terminal and a second terminal. The output line 16A is input to the first terminal. As described above, the output line 16A carries a plurality of analog signals including at least a first analog signal and a second analog signal that are tied together but are enabled at most one at a time. The reference signal output circuit 36A supplies or transmits a reference signal to an input terminal of the comparison circuit 32 in each column via a reference signal line or a wiring. To respective input terminals of the memory 42 in each column, an output terminal of the comparison circuit 32 in the corresponding column, the counter 44A, and the horizontal scanning circuit 50A are connected.

The horizontal scanning circuit 50A is a control circuit portion which sequentially supplies a control signal for outputting a pixel signal stored in the memory 42 in each column of the AD conversion circuit portion 30A, to the memory 42 in each column on a column by column basis. A control line of the horizontal scanning circuit 50A provided in association with each column of the pixel array 101 is connected to the memory 42 in the corresponding column When the memory 42 in each column receives a control signal via the control line in the corresponding column of the horizontal scanning circuit 50A, the memory 42 outputs the stored pixel signal to an output line 46A.

Similarly, the AD conversion circuit portion 30B includes a plurality of comparison circuits 32 and a plurality of memories 42, which are provided in association with the respective columns of the pixel array 101. The comparison circuit 32 and the memory 42 arranged in each column constitute a column AD conversion circuit portion. To respective input terminals of the comparison circuit 32 in each column, the output line 16B in the corresponding column and the reference signal output circuit 36B are connected. The reference signal output circuit 36B supplies a reference signal to the comparison circuit 32 in each column via a reference signal line. To respective input terminals of the memory 42 in each column, an output terminal of the comparison circuit 32 in the corresponding column, the counter 44B, and the horizontal scanning circuit 50B are connected.

Moreover, the horizontal scanning circuit 50B is a control circuit portion which sequentially supplies a control signal for outputting a pixel signal stored in the memory 42 in each column of the AD conversion circuit portion 30B, to the memory 42 in each column on a column by column basis. A control line of the horizontal scanning circuit 50B provided in association with each column of the pixel array 101 is connected to the memory 42 in the corresponding column When the memory 42 in each column receives a control signal via the control line in the corresponding column of the horizontal scanning circuit 50B, the memory 42 outputs the stored pixel signal to an output line 46B.

The timing generation circuit 60 (control circuit) is a control circuit portion which supplies, to the vertical scanning circuit 20, the comparison circuits 32, the reference signal output circuits 36A and 36B, the counters 44A and 44B, and the horizontal scanning circuits 50A and 50B, control signals for controlling operations and timings of them. At least some of these control signals can be configured to be supplied from the outside of the photoelectric conversion device 100.

Furthermore, control signals ΦCRES1, ΦCRES2, ΦCRES3, and ΦCRES4 illustrated in FIG. 1 are reset signals for the comparison circuits 32, which are supplied from the timing generation circuit 60 to the comparison circuits 32. The control signals ΦCRES1, ΦCRES2, ΦCRES3, and ΦCRES4 are supplied to the comparison circuits 32 in respective predetermined columns via the respective separate reset signal lines. Control signals ΦCRES1, ΦCRES2, ΦCRES3, and ΦCRES4 which are supplied to the AD conversion circuit portion 30A can be control signals different from respective control signals ΦCRES1, ΦCRES2, ΦCRES3, and ΦCRES4 which are supplied to the AD conversion circuit portion 30B.

Next, the outline of an operation of the photoelectric conversion device 100 according to the first exemplary embodiment is described with reference to FIG. 1.

Each of a plurality of pixels 12, which constitute the pixel array 101, includes a photoelectric conversion element such as a photodiode, and outputs a pixel signal, which is an analog signal, to the output line 16A or the output line 16B. The pixel signal which each pixel 12 outputs includes a signal corresponding to a signal quantity associated with the amount of incident light and a signal corresponding to a noise quantity (hereinafter, in some cases, referred to as a "noise signal"). Outputting of pixel signals from the pixels 12 is performed on a row by row basis according to control signals supplied from the vertical scanning circuit 20 via control lines under the control of the timing generation circuit 60. A pixel signal output from the pixel 12 to the output line 16A is input to the AD conversion circuit portion 30A. Moreover, a pixel signal output from the pixel 12 to the output line 16B is input to the AD conversion circuit portion 30B.

The pixel signal input from the pixel 12 to the AD conversion circuit portion 30A via the output line 16A is input to the comparison circuit 32 in the corresponding column. The comparison circuit 32 performs a comparison operation for comparing the signal level of the pixel signal with the signal level of a reference signal supplied from the reference signal output circuit 36A and then outputs a latch signal at timing when the magnitude relationship between the signal level of the pixel signal and the signal level of the ramp signal has inverted. A count signal supplied from the counter 44A and an output signal of the comparison circuit 32 are input to the memory 42. The memory 42 stores, as digital data of the pixel signal, a count value which the count signal indicates at timing when the latch signal has been received from the comparison circuit 32.

The horizontal scanning circuit 50A sequentially outputs control signals to the memories 42 of the AD conversion circuit portion 30A on a column by column basis under the control of the timing generation circuit 60. The memory 42 having received the control signal from the horizontal scanning circuit 50A outputs digital data obtained by performing AD conversion of the pixel signal to the output line 46A.

Similarly, the pixel signal input from the pixel 12 to the AD conversion circuit portion 30B via the output line 16B is input to the comparison circuit 32 in the corresponding column. The comparison circuit 32 performs a comparison operation for comparing the signal level of the pixel signal with the signal level of a reference signal supplied from the reference signal output circuit 36B and then outputs a latch signal at timing when the magnitude relationship between the signal level of the pixel signal and the signal level of the ramp signal has inverted. A count signal supplied from the counter 44B and an output signal of the comparison circuit 32 are input to the memory 42. The memory 42 stores, as digital data of the pixel signal, a count value which the count signal indicates at timing when the latch signal has been received from the comparison circuit 32.

Moreover, the horizontal scanning circuit 50B sequentially outputs control signals to the memories 42 of the AD conversion circuit portion 30B on a column by column basis under the control of the timing generation circuit 60. The memory 42 having received the control signal from the horizontal scanning circuit 50B outputs digital data obtained by performing AD conversion of the pixel signal to the output line 46B. Furthermore, while, in the first exemplary embodiment, a plurality of AD conversion circuit portions 30A and 30B is provided, only one AD conversion circuit portion can be provided.

Figure 2:
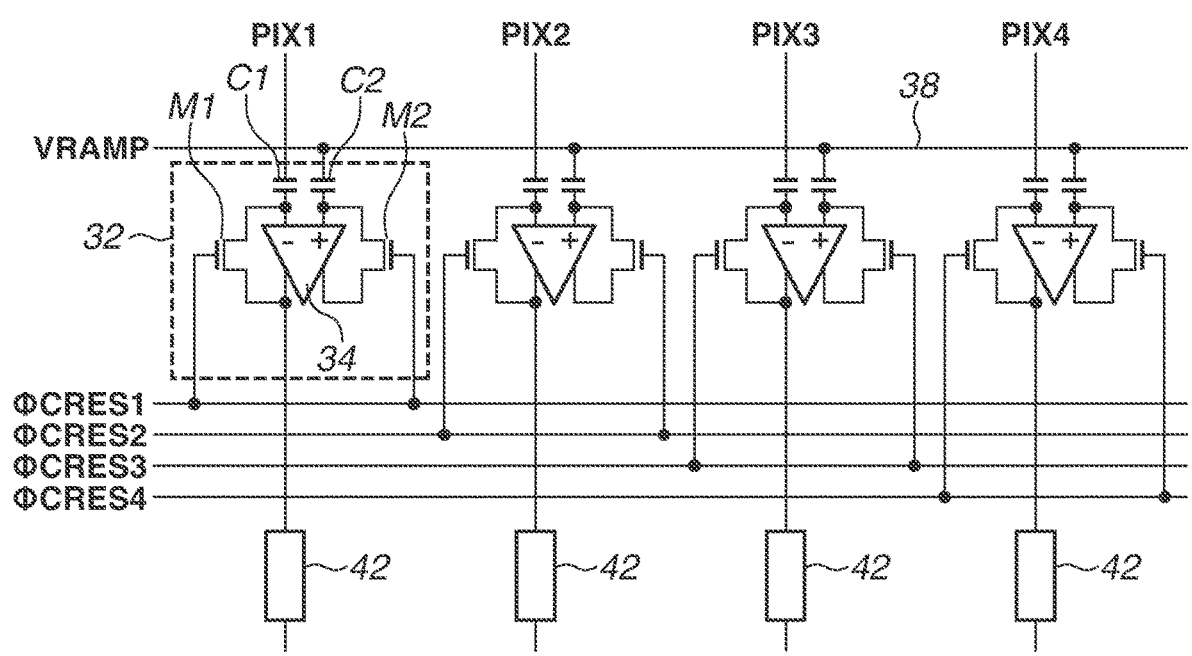
FIG. 2 is a diagram illustrating a configuration of a comparison circuit in the first exemplary embodiment.

Next, a configuration example of the comparison circuit 32 in the photoelectric conversion device 100 in the first exemplary embodiment is described with reference to FIG. 2. FIG. 2 is a circuit diagram illustrating a configuration example of the comparison circuit 32 in the photoelectric conversion device 100 in the first exemplary embodiment. While, here, the comparison circuit 32 included in the AD conversion circuit portion 30A is described as an example, the same also applies to the comparison circuit 32 included in the AD conversion circuit portion 30B. FIG. 2 illustrates four comparison circuits 32 provided in association with four contiguous columns of a plurality of columns included in the pixel array 101.

Each of comparison circuits 32 provided in association with the respective columns included in the pixel array 101 includes, as illustrated in FIG. 2, a differential pair circuit (hereinafter referred to as a "differential pair circuit 34"), an input capacitance to which a signal PIX is given (hereinafter referred to as an "input capacitance C1"), and an input capacitance to which a signal VRAMP is given (hereinafter referred to as an "input capacitance C2"). The differential pair circuit 34 includes a minus side input terminal, a plus side input terminal, and two output terminals corresponding to these input terminals (i.e., a plus side output terminal and a minus side output terminal). The comparison circuit 32 further includes a transistor connected to the minus side input terminal and one output terminal (hereinafter referred to as a "transistor M1") and a transistor connected to the plus side input terminal and the other output terminal (hereinafter referred to as a "transistor M2"). The differential pair circuit 34 includes a minus side input terminal, a plus side input terminal, and two output terminals corresponding to these input terminals (i.e., a plus side output terminal and a minus side output terminal). The output line 16A illustrated in FIG. 1 is connected to the minus side input terminal of the differential pair circuit 34 via the input capacitance C1. For example, a reference signal line (hereinafter referred to as a "reference signal line 38") is connected to the plus side input terminal of the differential pair circuit 34 via the input capacitance C2. Between the minus side input terminal and the plus side output terminal of the differential pair circuit 34, the transistor M1, which controls connection states (conduction and non-conduction) between these terminals, is provided. Between the plus side input terminal and the minus side output terminal of the differential pair circuit 34, the transistor M2, which controls connection states (conduction and non-conduction) between these terminals, is provided. To the plus side output terminal of the differential pair circuit 34, the memory 42 in the corresponding column is connected.

The pixel signal PIX is input to the minus side input terminal of the differential pair circuit 34 from a pixel 12 in the corresponding column via the output line 16A and the input capacitance C1. Here, for the sake of explanation, in order from the leftmost comparison circuit 32 in FIG. 2, pixel signals PIX1, PIX2, PIX3, and PIX4 are assumed to be input to the respective comparison circuits 32. For example, the reference signal VRAMP is input to the plus side input terminal of the differential pair circuit 34 from the reference signal output circuit 36A via the reference signal line 38 and the input capacitance C2.

The transistors M1 and M2 of each comparison circuit 32 are controlled by the common control signal ΦCRES. Here, in order from the leftmost comparison circuit 32 in FIG. 2, control signals ΦCRES1, ΦCRES2, ΦCRES3, and ΦCRES4 are assumed to be supplied. In response to the control signal ΦCRES becoming at high level and, thus, the transistors M1 and M2 turning on, the threshold voltage of the comparison circuit 32 is reset to a voltage equivalent to a potential difference between the pixel signal PIX which is being output at that time and the reference signal VRAMP. This enables setting offset levels which vary according to timings of the control signals ΦCRES1, ΦCRES2, ΦCRES3, and ΦCRES4 to the comparison circuits 32 in the respective columns.

An operation of setting the threshold voltage of the comparison circuit 32 in the above-mentioned way is referred to as "resetting of the comparison circuit 32" or "auto-zero of the comparison circuit 32". Since the threshold voltages of the comparison circuits 32 are determined by timings of the control signals ΦCRES1, ΦCRES2, ΦCRES3, and ΦCRES4, it can be said that the control signals ΦCRES1, ΦCRES2, ΦCRES3, and ΦCRES4 reset the threshold voltages of the comparison circuits 32.

Furthermore, the threshold voltage of the comparison circuit 32 is a voltage equivalent to a difference between the signal level of a pixel signal and the signal level of a reference signal obtained when the level of a comparison signal which is output from the comparison circuit 32 changes. Thus, the comparison circuit 32 outputs a comparison signal which indicates a level which differs between a case where a difference between the level of a pixel signal and the level of a reference signal is smaller than the threshold value and a case where the difference is larger than the threshold value.

Next, an operation of the AD conversion circuit portion 30A in the photoelectric conversion device 100 in the first exemplary embodiment is described in more detail with reference to FIGS. 3A and 3B.

First, a driving method for the photoelectric conversion device 100 in the first exemplary embodiment is described with reference to FIGS. 3A and 3B.

Figure 3A:
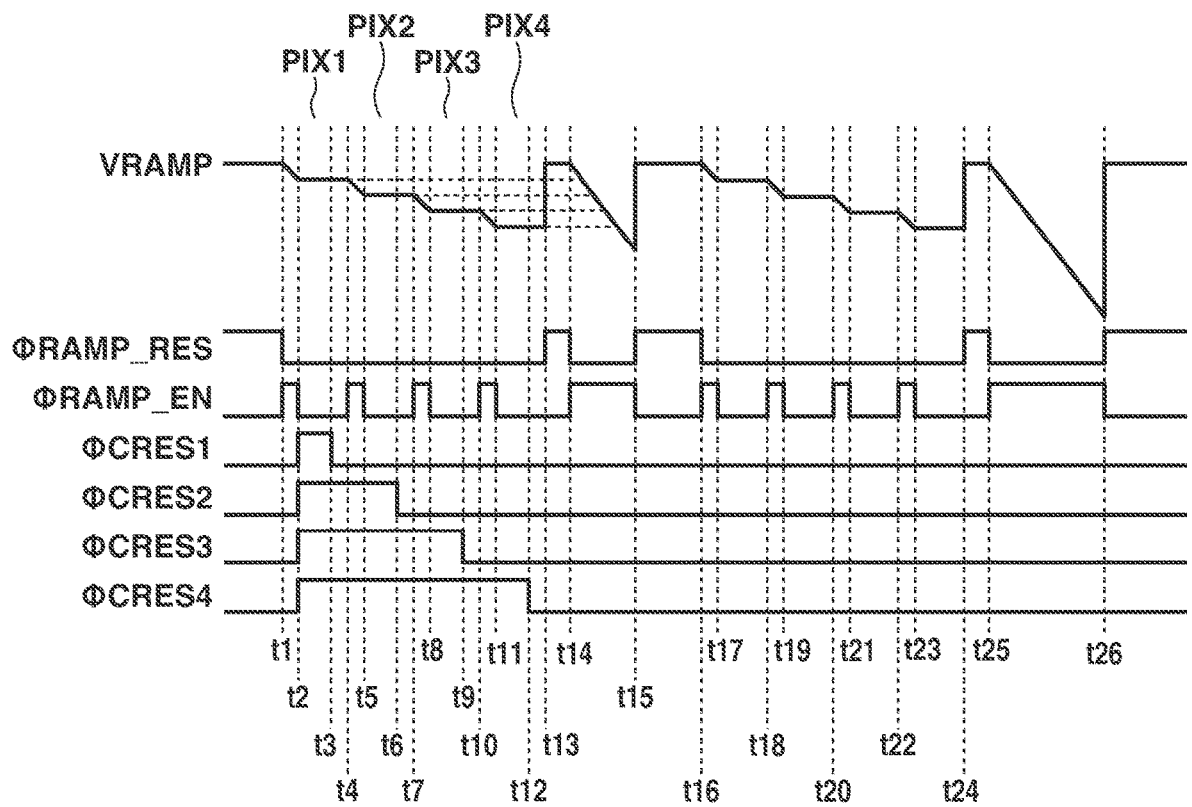
FIG. 3A is a diagram illustrating an operation of the photoelectric conversion device in the first exemplary embodiment.
Figure 3B:
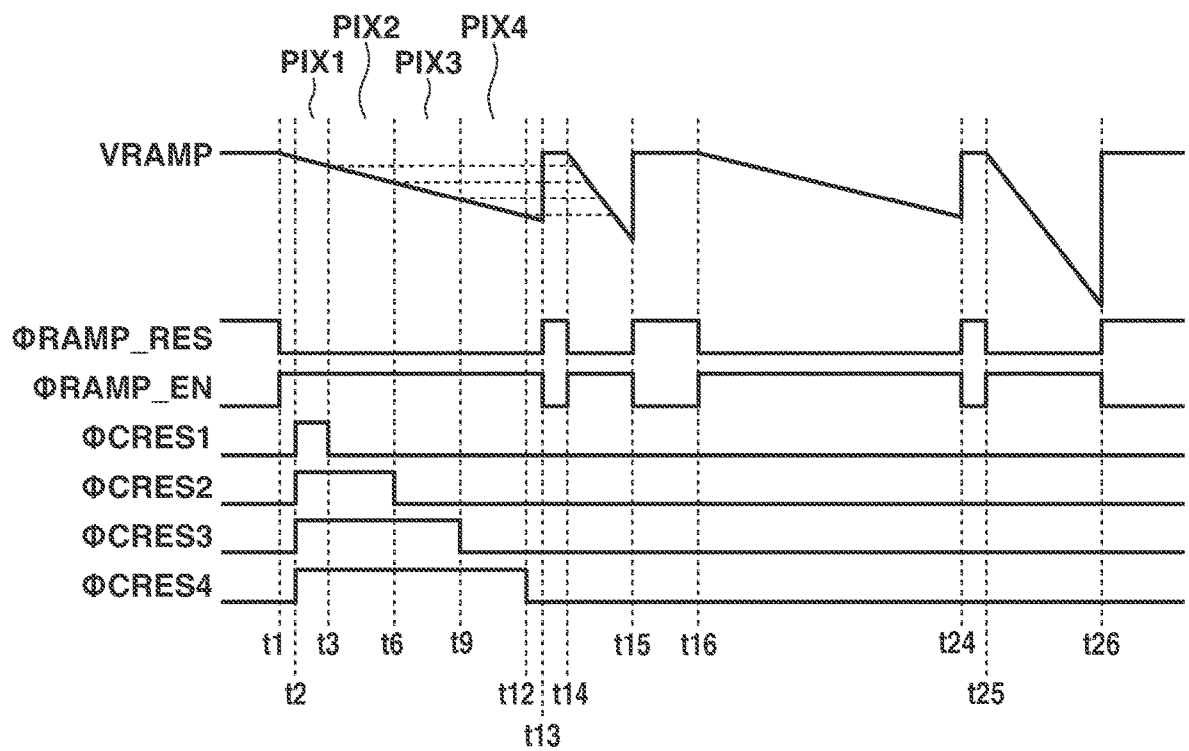
FIG. 3B is a diagram illustrating an operation of the photoelectric conversion device in the first exemplary embodiment.

FIGS. 3A and 3B illustrate signal levels of a reference signal VRAMP and control signals ΦRAMP_RES, ΦRAMP_EN, ΦCRES1, ΦCRES2, ΦCRES3, and ΦCRES4. The control signal ΦRAMP_RES is a reset signal for the reference signal output circuit 36, which is supplied from the timing generation circuit 60 to the reference signal output circuit 36. When the control signal ΦRAMP_RES becomes at high level, the reference signal output circuit 36 enters into a reset state, so that the output of the reference signal output circuit 36 becomes at the reference level. Moreover, the control signal ΦRAMP_EN is an enable signal for the reference signal VRAMP, and, when the control signal ΦRAMP_EN is at high level, the signal level of the reference signal VRAMP varies as time proceeds.

In an initial state before time t1, the control signal ΦRAMP_RES is at high level and the control signals ΦRAMP_EN, ΦCRES1, ΦCRES2, ΦCRES3, and ΦCRES4 are at low level. The reference signal VRAMP is at a reference electric potential in response to the control signal ΦRAMP_RES being at high level.

First, at time t1, the timing generation circuit 60 controls the control signal ΦRAMP_RES to change from high level to low level. With this change, the reset state of the reference signal output circuit 36 is canceled.

Moreover, at the same time t1, the timing generation circuit 60 controls the control signal ΦRAMP_EN to change from low level to high level. With this change, the electric potential of the reference signal VRAMP gradually varies (decreases) from the reference electric potential as time proceeds.

Next, at time t2, the timing generation circuit 60 controls the control signal ΦRAMP_EN to change from high level to low level. With this change, the electric potential of the reference signal VRAMP becomes not changing, so that the reference signal VRAMP becomes kept constant at a first voltage level lower than the reference level.

Moreover, at the same time t2, the timing generation circuit 60 controls the control signals ΦCRES1, ΦCRES2, ΦCRES3, and ΦCRES4 to change from low level to high level. With this change, the transistors M1 and M2 of the comparison circuit 32 are turned on and the input terminals and output terminals thereof are, therefore, short-circuited, so that the comparison circuit 32 enters into a reset state.

Next, at time t3, the timing generation circuit 60 controls the control signal ΦCRES1 to change from high level to low level. With this change, the first voltage level or electric potential of the VRAM signal at the wiring connected to the second terminal is clamped as an offset level on the comparison circuit 32 in a column to which the control signal ΦCRES1 is supplied. The changing of the control signal ΦCRES1 is referred to as the first operation. The clamped offset level is referred to as a first electric potential. In other words, the first operation changes an electric potential of the VRAM signal at the wiring from a predetermined electric potential, which is the initial electric potential, to a first electric potential to cause one of the comparison circuits of the plurality of comparison circuits to retain a first offset.

Thus, a first offset is retained at the comparison circuit 32 in a column to which the control signal ΦCRES1 is supplied, which is one of some column circuits. At this time, a pixel signal PIX corresponding to a noise quantity (noise signal) is being output to the output line 16A, so that the threshold voltage of the comparison circuit 32 in a column to which the control signal ΦCRES1 is supplied is reset to a voltage equivalent to a potential difference between the level of the pixel signal PIX1 and the first voltage level.

Next, at time t4, the timing generation circuit 60 controls the control signal ΦRAMP_EN to change from low level to high level. With this change, the voltage level of the reference signal VRAMP gradually varies (decreases) from the first voltage level as time proceeds.

Next, at time t5, the timing generation circuit 60 controls the control signal ΦRAMP_EN to change from high level to low level. With this change, the voltage level of the reference signal VRAMP becomes not changing, so that the reference signal VRAMP becomes kept constant at a second voltage level lower than the first voltage level.

Next, at time t6, the timing generation circuit 60 controls the control signal ΦCRES2 to change from high level to low level. With this change, the second voltage level is clamped as an offset level on the comparison circuit 32 in a column to which the control signal ΦCRES2 is supplied.(a fifth operation)

Thus, a second offset is retained at the comparison circuit 32 in a column to which the control signal ΦCRES2 is supplied, which is one of some other column circuits. At this time, a pixel signal PIX corresponding to a noise quantity (noise signal) is being output to the output line 16A, so that the threshold voltage of the comparison circuit 32 in a column to which the control signal ΦCRES2 is supplied is reset to a voltage equivalent to a potential difference between the level of the pixel signal PIX2 and the second voltage level.

Next, at time t7, the timing generation circuit 60 controls the control signal ΦRAMP_EN to change from low level to high level. With this change, the voltage level of the reference signal VRAMP gradually varies (decreases) from the second voltage level as time proceeds.

Next, at time t8, the timing generation circuit 60 controls the control signal ΦRAMP_EN to change from high level to low level. With this change, the voltage level of the reference signal VRAMP becomes not changing, so that the reference signal VRAMP becomes kept constant at a third voltage level lower than the second voltage level.

Next, at time t9, the timing generation circuit 60 controls the control signal ΦCRES3 to change from high level to low level. With this change, the third voltage level is clamped as an offset level on the comparison circuit 32 in a column to which the control signal ΦCRES3 is supplied.

Thus, a third offset is retained at the comparison circuit 32 in a column to which the control signal ΦCRES3 is supplied, which is one of some other column circuits. At this time, a pixel signal PIX corresponding to a noise quantity (noise signal) is being output to the output line 16A, so that the threshold voltage of the comparison circuit 32 in a column to which the control signal ΦCRES3 is supplied is reset to a voltage equivalent to a potential difference between the level of the pixel signal PIX3 and the third voltage level.

Next, at time t10, the timing generation circuit 60 controls the control signal ΦRAMP_EN to change from low level to high level. With this change, the voltage level of the reference signal VRAMP gradually varies (decreases) from the third voltage level as time proceeds.

Next, at time t11, the timing generation circuit 60 controls the control signal ΦRAMP_EN to change from high level to low level. With this change, the voltage level of the reference signal VRAMP becomes not changing, so that the reference signal VRAMP becomes kept constant at a fourth voltage level (an example of a first electric potential) lower than the third voltage level.

Next, at time t12, the timing generation circuit 60 controls the control signal ΦCRES4 to change from high level to low level. With this change, the fourth voltage level is clamped as an offset level on the comparison circuit 32 in a column to which the control signal ΦCRES4 is supplied. Thus, a fourth offset is retained at the comparison circuit 32 in a column to which the control signal ΦCRES4 is supplied, which is one of some other column circuits. At this time, a pixel signal PIX corresponding to a noise quantity (noise signal) is being output to the output line 16A, so that the threshold voltage of the comparison circuit 32 in a column to which the control signal ΦCRES4 is supplied is reset to a voltage equivalent to a potential difference between the level of the pixel signal PIX4 and the fourth voltage level. (a first operation)

Next, at time t13, the timing generation circuit 60 controls the control signal ΦRAMP_RES to change from low level to high level. With this change, the reference signal output circuit 36 enters into a reset state, so that the voltage level of the reference signal VRAMP returns to the reference level.

Next, at time t14, the timing generation circuit 60 controls the control signal ΦRAMP_RES to change from high level to low level. With this change, the reset state of the reference signal output circuit 36 is canceled.

Moreover, at the same time t14, the timing generation circuit 60 controls the control signal ΦRAMP_EN to change from low level to high level. With this change, the voltage level of the reference signal VRAMP gradually varies (decreases) from the reference level as time proceeds.

A period from time t14 to time t15 is a period in which AD conversion (a second operation) on the pixel signals PIX1, PIX2, PIX3, and PIX4 corresponding to noise quantities is performed.

When the voltage level of the reference signal VRAMP has reached the first voltage level, the potential difference between the level of the pixel signal PIX1 and the reference signal VRAMP becomes a threshold voltage of the comparison circuit 32 in the corresponding column, so that the level of the output signal of the comparison circuit 32 is reversed. The memory 42 in the corresponding column stores, as digital data of the pixel signal PIX1, a count value corresponding to a count signal which is being received from the counter 44A at timing when the level of the output signal of the comparison circuit 32 has been reversed.

When the voltage level of the reference signal VRAMP has further decreased and then reached the second voltage level, the potential difference between the level of the pixel signal PIX2 and the reference signal VRAMP becomes a threshold voltage of the comparison circuit 32 in the corresponding column, so that the level of the output signal of the comparison circuit 32 is reversed. The memory 42 in the corresponding column stores, as digital data of the pixel signal PIX2, a count value corresponding to a count signal which is being received from the counter 44A at timing when the level of the output signal of the comparison circuit 32 has been reversed.

When the voltage level of the reference signal VRAMP has further decreased and then reached the third voltage level, the potential difference between the level of the pixel signal PIX3 and the reference signal VRAMP becomes a threshold voltage of the comparison circuit 32 in the corresponding column, so that the level of the output signal of the comparison circuit 32 is reversed. The memory 42 in the corresponding column stores, as digital data of the pixel signal PIX3, a count value corresponding to a count signal which is being received from the counter 44A at timing when the level of the output signal of the comparison circuit 32 has been reversed.

When the voltage level of the reference signal VRAMP has further decreased and then reached the fourth voltage level, the potential difference between the level of the pixel signal PIX4 and the reference signal VRAMP becomes a threshold voltage of the comparison circuit 32 in the corresponding column, so that the level of the output signal of the comparison circuit 32 is reversed. The memory 42 in the corresponding column stores, as digital data of the pixel signal PIX4, a count value corresponding to a count signal which is being received from the counter 44A at timing when the level of the output signal of the comparison circuit 32 has been reversed.

Next, at time t15, the timing generation circuit 60 controls the control signal ΦRAMP_EN to change from high level to low level, and controls the control signal ΦRAMP_RES to change from low level to high level. With these changes, the reference signal output circuit 36 enters into a reset state, so that the voltage level of the reference signal VRAMP returns to the reference level.

Next, an operation which is performed at time t16 and subsequent times is described.

Before AD conversion of a light signal is performed, the reference signal output circuit 36 re-performs driving which the reference signal output circuit 36 has performed at times t1 to t14.

At time t16, the timing generation circuit 60 controls the control signal ΦRAMP_RES to change from high level to low level. With this change, the reset state of the reference signal output circuit 36 is canceled.

Moreover, at the same time t16, the timing generation circuit 60 controls the control signal ΦRAMP_EN to change from low level to high level. With this change, the voltage level of the reference signal VRAMP gradually varies (decreases) from the reference voltage level as time proceeds.

Next, at time t17, the timing generation circuit 60 controls the control signal ΦRAMP_EN to change from high level to low level. With this change, the voltage level of the reference signal VRAMP becomes not changing, so that the reference signal VRAMP becomes kept constant at the first voltage level lower than the reference level.

Next, at time t18, the timing generation circuit 60 controls the control signal ΦRAMP_EN to change from low level to high level. With this change, the voltage level of the reference signal VRAMP gradually varies (decreases) from the first voltage level as time proceeds.

Next, at time t19, the timing generation circuit 60 controls the control signal ΦRAMP_EN to change from high level to low level. With this change, the voltage level of the reference signal VRAMP becomes not changing, so that the reference signal VRAMP becomes kept constant at the second voltage level lower than the first voltage level.

Next, at time t20, the timing generation circuit 60 controls the control signal ΦRAMP_EN to change from low level to high level. With this change, the voltage level of the reference signal VRAMP gradually varies (decreases) from the second voltage level as time proceeds.

Next, at time t21, the timing generation circuit 60 controls the control signal ΦRAMP_EN to change from high level to low level. With this change, the voltage level of the reference signal VRAMP becomes not changing, so that the reference signal VRAMP becomes kept constant at the third voltage level lower than the second voltage level.

Next, at time t22, the timing generation circuit 60 controls the control signal ΦRAMP_EN to change from low level to high level. With this change, the voltage level of the reference signal VRAMP gradually varies (decreases) from the third voltage level as time proceeds.

Next, at time t23, the timing generation circuit 60 controls the control signal ΦRAMP_EN to change from high level to low level. With this change, the voltage level of the reference signal VRAMP becomes not changing, so that the reference signal VRAMP becomes kept constant at the fourth voltage level lower than the third voltage level. (a third operation)

Next, at time t24, the timing generation circuit 60 controls the control signal ΦRAMP_RES to change from low level to high level. With this change, the reference signal output circuit 36 enters into a reset state, so that the voltage level of the reference signal VRAMP returns to the reference level.

Next, at time t25, the timing generation circuit 60 controls the control signal ΦRAMP_RES to change from high level to low level. With this change, the reset state of the reference signal output circuit 36 is canceled.

Moreover, at the same time t25, the timing generation circuit 60 controls the control signal ΦRAMP_EN to change from low level to high level. With this change, the voltage level of the reference signal VRAMP gradually varies (decreases) from the reference level as time proceeds.

A period from time t25 to time t26 is a period in which AD conversion on the pixel signals PIX1, PIX2, PIX3, and PIX4 corresponding to noise quantities associated with the amounts of incident light is performed. The reference signal VRAMP which is suppled from the reference signal output circuit 36A at this time is assumed to be a ramp signal corresponding to a light signal amplitude.

Next, at time t26, the timing generation circuit 60 controls the control signal ΦRAMP_EN to change from high level to low level, and controls the control signal ΦRAMP_RES to change from low level to high level. With these changes, the reference signal output circuit 36 enters into a reset state, so that the voltage level of the reference signal VRAMP returns to the reference level.

Performing driving according to the timing diagram of FIG. 3A in the above-mentioned way enables generating a plurality of offset levels and storing the plurality of offset levels in the comparison circuits 32, and thus enables preventing or reducing the outputs of all of the comparison circuits 32 from being reversed at the same time. As a result, it is possible to reduce noises caused by ohmic drop (IR drop) or current fluctuation accompanied by the simultaneous reversal of outputs of the comparison circuits 32 and, eventually, improve image quality.

Additionally, a driving sequence similar to driving of the reference signal output circuit 36 which is performed before AD conversion of a noise signal is also performed before AD conversion of a light signal. This facilitates equalizing an electric potential obtained before resetting to a starting potential for AD conversion of a noise signal is performed to an electric potential obtained before resetting to a starting potential for AD conversion of a light signal is performed.

According to the first exemplary embodiment, driving sequences of the reference signal output circuit 36 which are performed before AD conversion of a noise signal and before AD conversion of a light signal are equalized to each other. This enables, even in a case where reset times for a ramp signal before AD conversion of a noise signal and before AD conversion of a light signal are not able to be sufficiently taken, equalizing a ramp starting potential for AD conversion of a noise signal and a ramp starting potential for AD conversion of a light signal to each other.

As a result, since a decrease in the accuracy of correlated double sampling (CDS) becomes unlikely to occur, it is possible to make a decrease in signal quality after AD conversion unlikely to occur.

Furthermore, in the first exemplary embodiment, CDS is performed with four types of voltage levels which the comparison circuit 32 clamps as offset levels being set (for circuits in respective four columns, approximately, for respective four pixels). However, the types of voltage levels advantageous for the first exemplary embodiment are not limited to four types. At least two or more types of voltage levels only need to be set, and, unless there is any restriction on a readout time or a circuit configuration, offset levels the number of which corresponds to the number of circuit columns can be set.

Furthermore, in the first exemplary embodiment, the order of generation of offset levels does not need to be set to a descending order or ascending order of electric potential.

The order of generation of offset levels or the time interval thereof before starting of AD conversion of a light signal is equalized to that before starting of AD conversion of a noise signal. More additionally, offset levels and time intervals immediately before resetting of a ramp signal before AD conversion of a light signal and before AD conversion of a noise signal are equalized to each other.

Moreover, as illustrated in the timing diagram of FIG. 3B, the output waveform shape of a reference signal in determining offset levels of the comparison circuit 32 can be set not staircase-like but slope-like (triangular wave-like).

Even such a configuration enables attaining an advantageous effect similar to that in the configuration illustrated in FIG. 3A.

As a result, it is possible to prevent or reduce a decrease in CDS accuracy and prevent or reduce a decrease in signal quality after AD conversion.

While, in the first exemplary embodiment, changes of the electric potential of the reference signal before AD conversion of a light signal are set to a first electric potential, a second electric potential, a third electric potential, and a fourth electric potential, the first exemplary embodiment is not limited to this example. Thus, the following operation only needs to be performed in a period from after AD conversion of a signal corresponding to a noise quantity, which is an example of a first analog signal, until before AD conversion of a light signal, which is an example of a second analog signal. An electric potential of a wiring for transmitting a reference signal for causing a comparison circuit to retain an offset only needs to be set to an electric potential included in a variation range of electric potentials of the reference signal (in FIG. 3A, a range of from the reference electric potential to the fourth electric potential). Thus, the reference signal only needs to be set to an electric potential included in a range of from the reference electric potential to the fourth voltage level, which is a range of from the predetermined electric potential to the first electric potential. For example, the reference signal can be set to only the first voltage level. Even in this case, it is possible to facilitate equalizing the ramp starting potentials to each other as compared to a case where there is not provided a period in which the reference signal is set to an electric potential included in a range of from the predetermined electric potential to the first electric potential.

Moreover, in the case of setting the reference signal to one of electric potentials included in a range of from the reference electric potential to the fourth voltage level, which is a range of from the predetermined electric potential to the first electric potential, particularly, it is favorable to set the reference signal to an electric potential obtained immediately before returning the reference signal to the reference electric potential for performing AD conversion of the first analog signal. Thus, with regard to the configuration illustrated in FIG. 3A, the reference signal can be set, before time t24, to the electric potential obtained between time t11 and time t12. This enables easily equalizing the respective ramp starting potentials for AD conversion of the first analog signal and the second analog signal to each other. Furthermore, varying the electric potential of the wiring before AD conversion of the second analog signal in such a way as to be consistent with an operation for retaining offsets of the comparison circuit, as illustrated in FIGS. 3A and 3B, is the most favorable configuration in respect of easily equalizing the respective ramp starting potentials to each other. However, since this operation is time-consuming, as mentioned above, part of changes of the electric potentials of the wiring between time t16 to time t24 can be omitted.

Moreover, a plurality of times of retention of offsets of the respective comparison circuits in time t1 to time t13 does not need to be provided, and one time of retention can be provided in such a way as to retain a common offset for all of the column circuits. In this case, an advantageous effect of preventing or reducing the outputs of all of the comparison circuits 32 from being reversed at the same time, described in the first exemplary embodiment, becomes unlikely to be obtained. However, in this configuration, in a period from time t15 to time t24, the reference signal is configured to be set to an electric potential included in a range of from the predetermined electric potential to one electric potential for setting an offset. With this configuration, an advantageous effect of facilitating equalizing the respective ramp starting potentials for AD conversion of a plurality of analog signals to each other is obtained. Therefore, this configuration is also included in the scope of the present disclosure.

Furthermore, the direction in which to vary the reference signal in AD conversion is not limited to that described in the first exemplary embodiment, and the reference signal can be configured to be varied in a direction in which an electric potential thereof increases. In this case, with regard to changing of the electric potential for retaining an offset, similarly, the electric potential can be configured to be increased from the reference electric potential.

Figure 11:
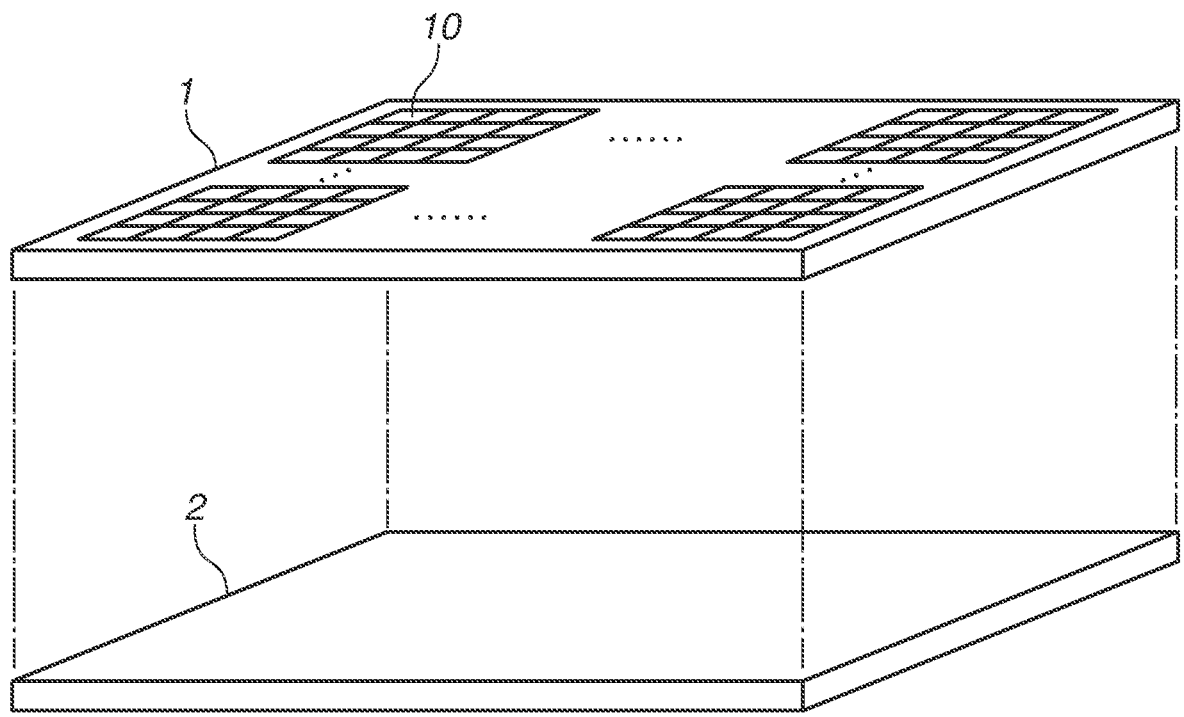
FIG. 11 is a diagram illustrating a configuration of a photoelectric conversion device in a modification example of the first exemplary embodiment.

Furthermore, in the first exemplary embodiment, a configuration in which all of the members illustrated in FIG. 1 are provided on a single substrate can be employed. As another example, a configuration in which, as illustrated in FIG. 11, a plurality of substrates is stacked in layers can be employed. In this case, the pixels 12 (also including pixels 12 in a third exemplary embodiment described below) included in each pixel array 10 (corresponding to the pixel array 101 illustrated in FIG. 1) can be provided on a first substrate 1 and the AD conversion circuit portions 30A and 30B illustrated in FIG. 1 can be provided on a second substrate 2. Additionally, the timing generation circuit 60, the vertical scanning circuit 20, the reference signal output circuits 36A and 36B, the counters 44A and 44B, and the horizontal scanning circuits 50A and 50B can be provided on the second substrate 2.

A second exemplary embodiment is described with a focus on differences from the first exemplary embodiment.

Figure 4:
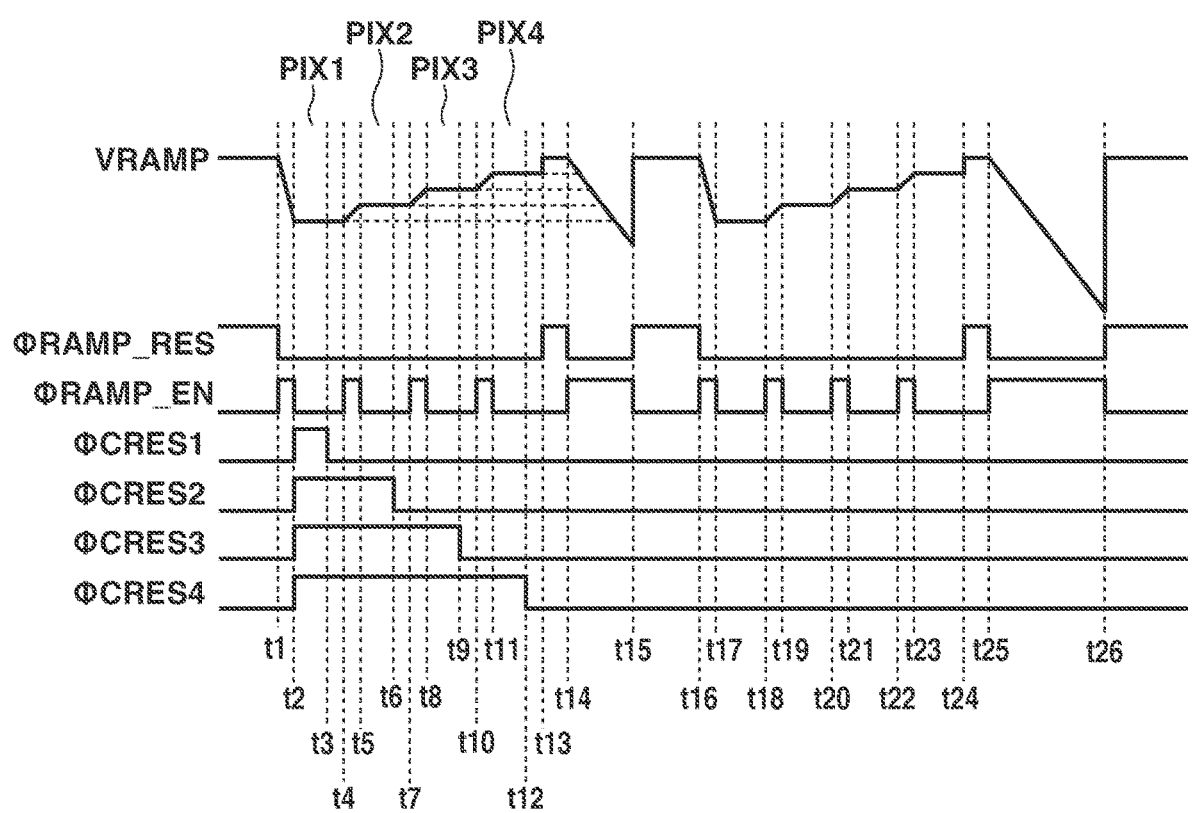
FIG. 4 is a diagram illustrating an operation of the photoelectric conversion device in a second exemplary embodiment.

FIG. 4 is a diagram illustrating an operation in the second exemplary embodiment. In the second exemplary embodiment, a configuration obtained by changing a control operation of the reference signal output circuit and replacing threshold voltage levels at the time of resetting or auto-zero of the comparison circuits 32 corresponding to the pixel signals PIX1, PIX2, PIX3, and PIX4 is employed.

Until time t1, a sequence similar to that illustrated in FIG. 3A or 3B is performed.

At time t2, the timing generation circuit 60 controls the control signal ΦRAMP_EN to change from high level to low level. With this change, the voltage level of the reference signal VRAMP becomes not changing, so that the reference signal VRAMP becomes kept constant at a fourth voltage level lower than the reference level.

Moreover, at the same time t2, the timing generation circuit 60 controls the control signals ΦCRES1, ΦCRES2, ΦCRES3, and ΦCRES4 to change from low level to high level. With this change, the transistors M1 and M2 of the comparison circuit 32 are turned on and the input terminals and output terminals thereof are, therefore, short-circuited, so that the comparison circuit 32 enters into a reset state.

Next, at time t3, the timing generation circuit 60 controls the control signal ΦCRES1 to change from high level to low level. With this change, the fourth voltage level is clamped as an offset level on the comparison circuit 32 in a column to which the control signal ΦCRES1 is supplied.

At this time, a pixel signal PIX corresponding to a noise quantity is being output to the output line 16A, so that the threshold voltage of the comparison circuit 32 in a column to which the control signal ΦCRES1 is supplied is reset to a voltage equivalent to a potential difference between the level of the pixel signal PIX1 and the fourth voltage level.

Next, at time t4, the timing generation circuit 60 controls the control signal ΦRAMP_EN to change from low level to high level. With this change, the voltage level of the reference signal VRAMP gradually varies (increases) from the fourth voltage level as time proceeds.

Next, at time t5, the timing generation circuit 60 controls the control signal ΦRAMP_EN to change from high level to low level. With this change, the voltage level of the reference signal VRAMP becomes not changing, so that the reference signal VRAMP becomes kept constant at a third voltage level higher than the fourth voltage level.

Next, at time t6, the timing generation circuit 60 controls the control signal ΦCRES2 to change from high level to low level. With this change, the third voltage level is clamped as an offset level on the comparison circuit 32 in a column to which the control signal ΦCRES2 is supplied.

At this time, a pixel signal PIX corresponding to a noise quantity is being output to the output line 16A, so that the threshold voltage of the comparison circuit 32 in a column to which the control signal ΦCRES2 is supplied is reset to a voltage equivalent to a potential difference between the level of the pixel signal PIX2 and the third voltage level.

Next, at time t7, the timing generation circuit 60 controls the control signal ΦRAMP_EN to change from low level to high level. With this change, the voltage level of the reference signal VRAMP gradually varies (increases) from the third voltage level as time proceeds.

Next, at time t8, the timing generation circuit 60 controls the control signal ΦRAMP_EN to change from high level to low level. With this change, the voltage level of the reference signal VRAMP becomes not changing, so that the reference signal VRAMP becomes kept constant at a second voltage level higher than the third voltage level.

Next, at time t9, the timing generation circuit 60 controls the control signal ΦCRES3 to change from high level to low level. With this change, the second voltage level is clamped as an offset level on the comparison circuit 32 in a column to which the control signal ΦCRES3 is supplied.

At this time, a pixel signal PIX corresponding to a noise quantity is being output to the output line 16A, so that the threshold voltage of the comparison circuit 32 in a column to which the control signal ΦCRES3 is supplied is reset to a voltage equivalent to a potential difference between the level of the pixel signal PIX3 and the second voltage level.

Next, at time t10, the timing generation circuit 60 controls the control signal ΦRAMP_EN to change from low level to high level. With this change, the voltage level of the reference signal VRAMP gradually varies (increases) from the second voltage level as time proceeds.

Next, at time t11, the timing generation circuit 60 controls the control signal ΦRAMP_EN to change from high level to low level. With this change, the voltage level of the reference signal VRAMP becomes not changing, so that the reference signal VRAMP becomes kept constant at a first voltage level higher than the second voltage level.

Next, at time t12, the timing generation circuit 60 controls the control signal ΦCRES4 to change from high level to low level. With this change, the first voltage level is clamped as an offset level on the comparison circuit 32 in a column to which the control signal ΦCRES4 is supplied. At this time, a pixel signal PIX corresponding to a noise quantity is being output to the output line 16A, so that the threshold voltage of the comparison circuit 32 in a column to which the control signal ΦCRES4 is supplied is reset to a voltage equivalent to a potential difference between the level of the pixel signal PIX4 and the first voltage level.(a first operation)

Next, at time t13, the timing generation circuit 60 controls the control signal ΦRAMP_RES to change from low level to high level. With this change, the reference signal output circuit 36 enters into a reset state, so that the voltage level of the reference signal VRAMP returns to the reference level.

Timings and driving purposes at time t14 to time t16 are similar to those described with reference to FIG. 3A. (a second operation)

Next, only in the reference signal output circuit, a driving sequence at time t1 to time t14 is repeated.

This is an insertion of a driving sequence which is meaningless from a functional perspective, but just is one exemplary embodiment of the present disclosure.

At time t16, the timing generation circuit 60 controls the control signal ΦRAMP_RES to change from high level to low level. With this change, the reset state of the reference signal output circuit 36 is canceled.

Moreover, at the same time t16, the timing generation circuit 60 controls the control signal ΦRAMP_EN to change from low level to high level. With this change, the voltage level of the reference signal VRAMP gradually varies (decreases) from the reference voltage level as time proceeds.

Next, at time t17, the timing generation circuit 60 controls the control signal ΦRAMP_EN to change from high level to low level. With this change, the voltage level of the reference signal VRAMP becomes not changing, so that the reference signal VRAMP becomes kept constant at the fourth voltage level lower than the reference level.

Next, at time t18, the timing generation circuit 60 controls the control signal ΦRAMP_EN to change from low level to high level. With this change, the voltage level of the reference signal VRAMP gradually varies (increases) from the fourth voltage level as time proceeds.

Next, at time t19, the timing generation circuit 60 controls the control signal ΦRAMP_EN to change from high level to low level. With this change, the voltage level of the reference signal VRAMP becomes not changing, so that the reference signal VRAMP becomes kept constant at the third voltage level higher than the fourth voltage level.

Next, at time t20, the timing generation circuit 60 controls the control signal ΦRAMP_EN to change from low level to high level. With this change, the voltage level of the reference signal VRAMP gradually varies (increases) from the third voltage level as time proceeds.

Next, at time t21, the timing generation circuit 60 controls the control signal ΦRAMP_EN to change from high level to low level. With this change, the voltage level of the reference signal VRAMP becomes not changing, so that the reference signal VRAMP becomes kept constant at the second voltage level higher than the third voltage level.

Next, at time t22, the timing generation circuit 60 controls the control signal ΦRAMP_EN to change from low level to high level. With this change, the voltage level of the reference signal VRAMP gradually varies (increases) from the second voltage level as time proceeds.

Next, at time t23, the timing generation circuit 60 controls the control signal ΦRAMP_EN to change from high level to low level. With this change, the voltage level of the reference signal VRAMP becomes not changing, so that the reference signal VRAMP becomes kept constant at the first voltage level higher than the second voltage level. (a third operation)

Next, at time t24, the timing generation circuit 60 controls the control signal ΦRAMP_RES to change from low level to high level. With this change, the reference signal output circuit 36 enters into a reset state, so that the voltage level of the reference signal VRAMP returns to the reference level.

The subsequent timings and driving operations are similar to those described with reference to FIG. 3A.

Performing driving according to the timing diagram of FIG. 4 in the above-mentioned way enables attaining an advantageous effect similar to that described in the first exemplary embodiment.

Moreover, the electric potential level obtained before resetting to the respective ramp starting potentials for AD conversion of the first analog signal and the second analog signal is performed is set to an electric potential closer to the ramp starting potential than that in the first exemplary embodiment. This more facilitates easily equalizing the respective ramp starting potentials for AD conversion of a signal corresponding to a noise quantity (noise signal) and a light signal to each other than in the first exemplary embodiment.

According to the second exemplary embodiment, driving sequences of the reference signal output circuit 36 which are performed before AD conversion of a noise signal and before AD conversion of a light signal are equalized to each other. This enables, even in a case where reset times for a ramp signal before AD conversion of a noise signal and before AD conversion of a light signal are not able to be sufficiently taken, equalizing a ramp starting potential for AD conversion of a noise signal and a ramp starting potential for AD conversion of a light signal to each other.

As a result, it is possible to prevent or reduce a decrease in CDS accuracy and prevent or reduce a decrease in signal quality after AD conversion.

A third exemplary embodiment is described with a focus on differences from the first exemplary embodiment.

The third exemplary embodiment differs from the first exemplary embodiment in that each pixel 12 included in the pixel array 101 includes a plurality of photoelectric conversion portions corresponding to one microlens.

Figure 5:
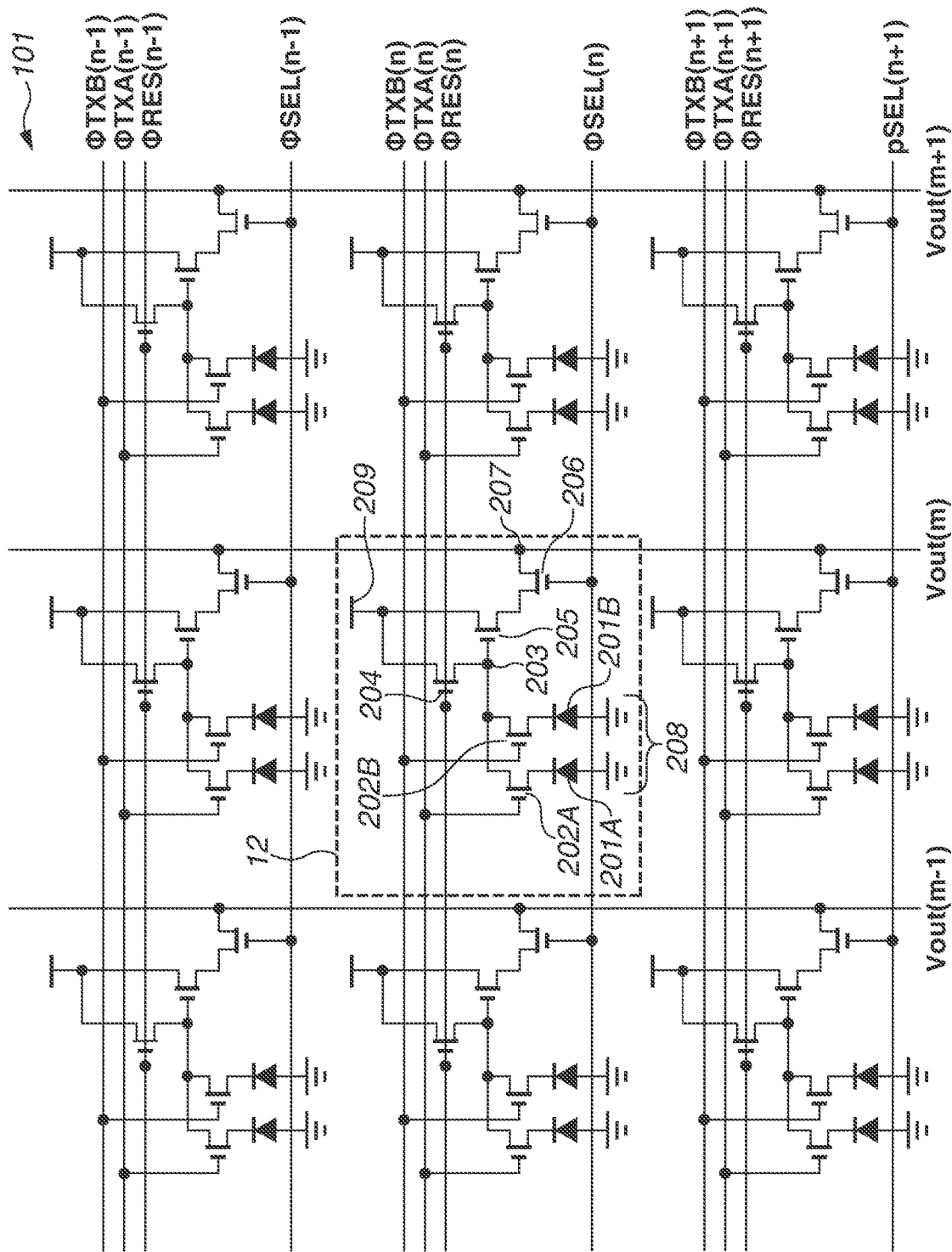
FIG. 5 is a diagram illustrating a configuration of a pixel in a third exemplary embodiment.

FIG. 5 illustrates an equivalent circuit of each pixel 12, which is used to explain a photoelectric conversion device according to the third exemplary embodiment. In FIG. 5, nine pixels 12 in three rows by three columns are illustrated from among a plurality of pixels 12 two-dimensionally arrayed in the row direction and column direction.

Each of a plurality of pixels 12 includes two photoelectric conversion portions (hereinafter also referred to as "PDs") 201A and 201B, two transfer transistors 202A and 202B, and a floating diffusion (hereinafter also referred to as "FD") 203. The pixel 12 has an image plane phase-difference autofocus (AF) function because of being able to detect a phase difference of respective signals output from the two PDs. Moreover, the pixel 12 further includes a reset transistor 204, an amplification transistor 205, and a row selection transistor 206. Additionally, the pixel 12 further includes an output portion 207, which is connected to a vertical output line Vout, ground 208, which is connected to the ground potential, and a power source 209.

The PD 201 photoelectrically converts incident light and accumulates electric charges obtained by photoelectric conversion.

When being turned on, the transfer transistor 202 transfers an electric charge of the PD to the FD.

The amplification transistor 205, which constitutes a source follower circuit, outputs a signal that is based on a voltage of the FD to the vertical output line Vout via the row selection transistor 206. Moreover, when the reset transistor 204 is turned on, the voltage of the FD is reset by the voltage of the power source 209.

A common control signal is supplied from the vertical scanning circuit 20 to pixels 12 in the same row. Thus, control signals $\Phi 202A(n)$, $\Phi 202B(n)$, $\Phi 204(n)$, and $\Phi 206(n)$ are supplied to the respective gates of the transfer transistors 202, the reset transistor 204, and the row selection transistor 206 in the n-th row. Each of these transistors is turned on when the corresponding control signal is at high level, and is turned off when the corresponding control signal is at low level.

Figure 6:
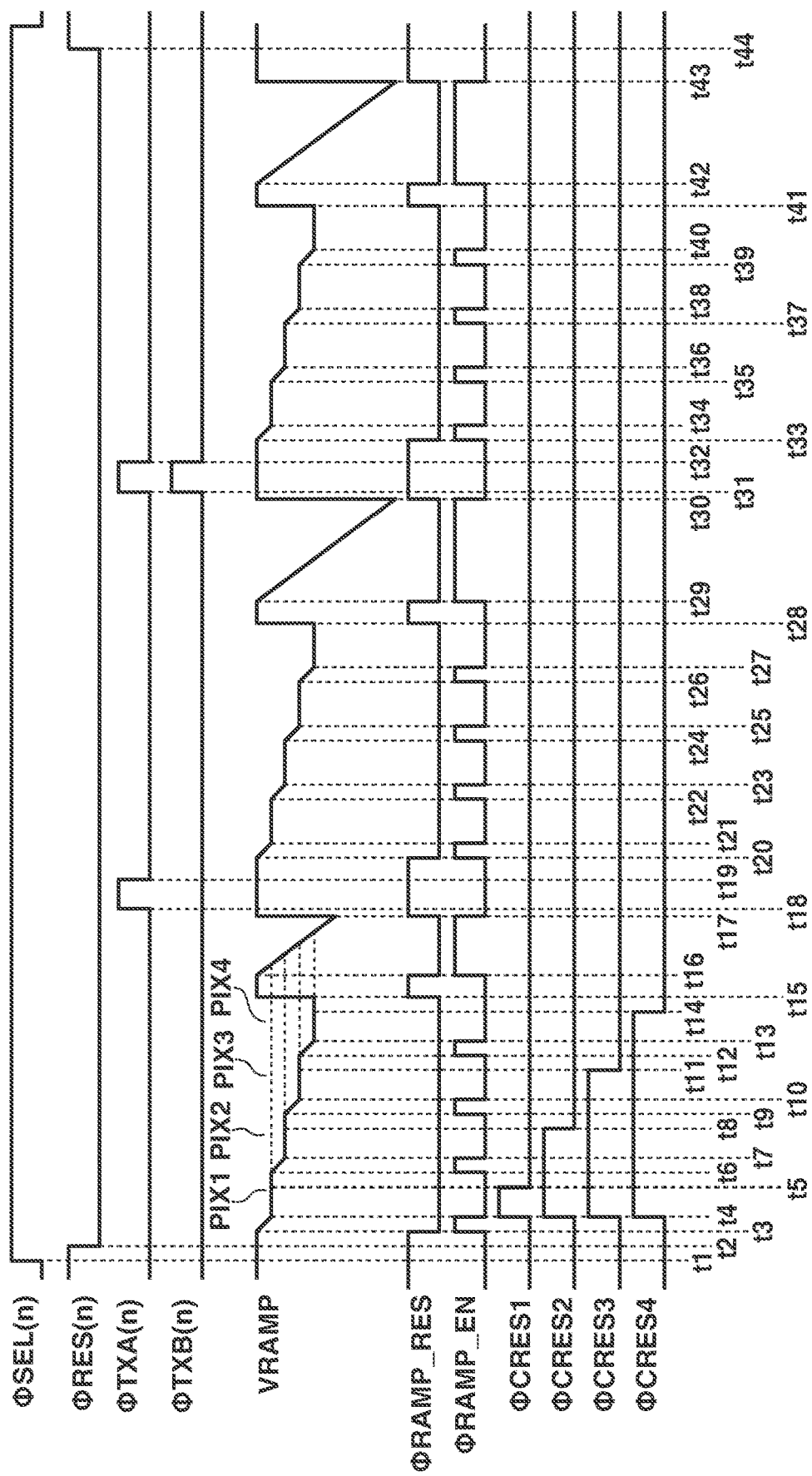
FIG. 6 is a diagram illustrating an operation of a photoelectric conversion device in the third exemplary embodiment.

FIG. 6 is a diagram illustrating an operation of the photoelectric conversion device including the pixels 12 illustrated in FIG. 5.

In FIG. 6, control signals and output signals concerning pixels 12 in the n-th row in one frame period of the photoelectric conversion device 100 are illustrated. More specifically, in FIG. 6, control signals $\Phi SEL(n)$, $\Phi RES(n)$, $\Phi TXA(n)$, and $\Phi TXB(n)$, which are supplied to the pixels 12 in the n-th row, are illustrated. An operation of the photoelectric conversion device 100 is described with reference to FIG. 6.

At time t1, the control signal $\Phi SEL(n)$ becomes at high level, so that the row selection transistor 206 is turned on. This brings about a state in which the pixels 12 in the n-th row have been selected. Then, at time t2, the control signal $\Phi RES(n)$ becomes at low level, so that the reset transistor 204 is turned off. With this operation, a reset noise signal level retained in the floating diffusion (FD) 203 of the pixel 12 is amplified by the amplification transistor 205 and is then output to the vertical output line Vout via the row selection transistor 206, thus being input to the AD conversion circuit portion 30.

After that, driving operations similar to those performed at time t1 to time t15 illustrated in FIG. 3A are performed at time t3 to time t17, so that the pixel reset noise signal is subjected to AD conversion.

At time t18, the control signal $\Phi TXA(n)$ becomes at high level, so that the transfer transistor 202A is turned on. Then, at time t19, the control signal $\Phi TXA(n)$ becomes at low level, so that the transfer transistor 202A is turned off. With this operation, an electric charge accumulated in the photoelectric conversion portion (PD) 201A of the pixel 12 is transferred to the floating diffusion (FD) 203 of the pixel 12 and is then amplified by the amplification transistor 205. The output of the amplification transistor 205 is output to the vertical output line Vout via the row selection transistor 206, thus being input to the AD conversion circuit portion 30.

After that, driving operations similar to those performed at time t16 to time t26 illustrated in FIG. 3A are performed at time t20 to time t30, so that a light signal accumulated in the photoelectric conversion portion (PD) 201A of the pixel 12 is subjected to AD conversion.

At time t31, the control signals $\Phi TXA(n)$ and $\Phi TXB(n)$ become at high level, so that the transfer transistors 202A and 202B are turned on. Then, at time t32, the control signals $\Phi TXA(n)$ and $\Phi TXB(n)$ become at low level, so that the transfer transistor 202A and the transfer transistor 202B are turned off. With this operation, an electric charge accumulated during time t19 to time t32 in the photoelectric conversion portion (PD) 201A of the pixel 12 and an electric charge accumulated in the photoelectric conversion portion (PD) 201B are transferred to the floating diffusion (FD) 203 of the pixel 12 and are then amplified by the amplification transistor 205. The output of the amplification transistor 205 is output to the vertical output line Vout via the row selection transistor 206, thus being input to the AD conversion circuit portion 30.

At time t33, the timing generation circuit 60 controls the control signal $\Phi RAMP\_RES$ to change from high level to low level. With this change, the reset state of the reference signal output circuit 36 is canceled.

Moreover, at the same time t33, the timing generation circuit 60 controls the control signal $\Phi RAMP\_EN$ to change from low level to high level. With this change, the voltage level of the reference signal VRAMP gradually varies (decreases) from the reference voltage level as time proceeds.

Next, at time t34, the timing generation circuit 60 controls the control signal $\Phi RAMP\_EN$ to change from high level to low level. With this change, the voltage level of the reference signal VRAMP becomes not changing, so that the reference signal VRAMP becomes kept constant at the first voltage level lower than the reference voltage level.

Next, at time t35, the timing generation circuit 60 controls the control signal $\Phi RAMP\_EN$ to change from low level to high level. With this change, the voltage level of the reference signal VRAMP gradually varies (decreases) from the first voltage level as time proceeds.

Next, at time t36, the timing generation circuit 60 controls the control signal $\Phi RAMP\_EN$ to change from high level to low level. With this change, the voltage level of the reference signal VRAMP becomes not changing, so that the reference signal VRAMP becomes kept constant at the second voltage level lower than the first voltage level.

Next, at time t37, the timing generation circuit 60 controls the control signal $\Phi RAMP\_EN$ to change from low level to high level. With this change, the voltage level of the reference signal VRAMP gradually varies (decreases) from the second voltage level as time proceeds.

Next, at time t38, the timing generation circuit 60 controls the control signal $\Phi RAMP\_EN$ to change from high level to low level. With this change, the voltage level of the reference signal VRAMP becomes not changing, so that the reference signal VRAMP becomes kept constant at the third voltage level lower than the second voltage level.

Next, at time t39, the timing generation circuit 60 controls the control signal ΦRAMP_EN to change from low level to high level. With this change, the voltage level of the reference signal VRAMP gradually varies (decreases) from the third voltage level as time proceeds.

Next, at time t40, the timing generation circuit 60 controls the control signal ΦRAMP_EN to change from high level to low level. With this change, the voltage level of the reference signal VRAMP becomes not changing, so that the reference signal VRAMP becomes kept constant at the fourth voltage level lower than the third voltage level.

Next, at time t41, the timing generation circuit 60 controls the control signal ΦRAMP_RES to change from low level to high level. With this change, the reference signal output circuit 36 enters into a reset state, so that the voltage level of the reference signal VRAMP returns to the reference level.

Next, at time t42, the timing generation circuit 60 controls the control signal ΦRAMP_RES to change from high level to low level. With this change, the reset state of the reference signal output circuit 36 is canceled.

Moreover, at the same time t42, the timing generation circuit 60 controls the control signal ΦRAMP_EN to change from low level to high level. With this change, the voltage level of the reference signal VRAMP gradually varies (decreases) from the reference level as time proceeds.

A period from time t42 to time t43 is a period in which AD conversion on a light signal corresponding to a signal quantity equivalent to the sum of the amounts of incident light to the PD 201A and the PD 201B of the pixel 12.

Furthermore, in more detail, the light signal which is read out in this period is a signal equivalent to a value obtained by adding together an electric charge accumulated in the photoelectric conversion portion (PD) 201A and an electric charge accumulated in the photoelectric conversion portion (PD) 201B.

With this processing, an "A+B" signal that is based on both an electric charge generated in the photoelectric conversion portion (PD) 201A of the pixel 12 and an electric charge generated in the photoelectric conversion portion (PD) 201B of the pixel 12 is acquired.

Next, at time t43, the timing generation circuit 60 controls the control signal ΦRAMP_EN to change from high level to low level, and controls the control signal ΦRAMP_RES to change from low level to high level. With these changes, the reference signal output circuit 36 enters into a reset state, so that the voltage level of the reference signal VRAMP returns to the reference level.

At time t44, the control signal ΦRES(n) becomes at high level, so that the reset transistor 204 is turned on. With this processing, the floating diffusion (FD) 203 returns to a reset state, and processing for readout from the pixels 12 in the n-th row ends.

A "B" signal is acquired by obtaining a difference between the "A+B" signal and a "A" signal by, for example, a signal processing circuit located outside the photoelectric conversion device 100 (e.g., an image capturing apparatus). The "A" signal and the "B" signal are signals that are based on electric charges generated from light fluxes having passed through respective different pupil regions of an imaging optical system (i.e., light fluxes obtained by pupil division) and are, therefore, focus detection signals which are able to be used for phase-difference focus detection. Moreover, the "A+B" signal is a captured image signal which is used for generation of an image. In this way, the photoelectric conversion device 100 according to the third exemplary embodiment is able to acquire focus detection signals and a captured image signal in parallel within one frame period.

Additionally, according to the third exemplary embodiment, there are provided respective driving sequences for the reference signal output circuit 36 which are performed before AD conversion of a noise signal and before AD conversion of each of the "A" signal and the "A+B" signal serving as a light signal. This enables, even in a case where reset times for a ramp signal before AD conversion of a noise signal and before AD conversion of a light signal are not able to be sufficiently taken, easily equalizing a ramp starting potential for AD conversion of a noise signal and a ramp starting potential for AD conversion of each of the "A" signal and the "A+B" signal serving as a light signal to each other.

Therefore, it is possible to prevent or reduce a decrease in CDS accuracy and prevent or reduce a decrease in signal quality after AD conversion.

A fourth exemplary embodiment is described with a focus on differences from the first exemplary embodiment.

The fourth exemplary embodiment is configured to perform AD conversion on one pixel signal a plurality of times and acquire, by, for example, a signal processing circuit in the subsequent stage, an average value of signals obtained by such AD conversion performed a plurality of times (hereinafter also referred to as "multi-sampling"). This enables preventing or reducing a random noise included in a pixel signal. The techniques described in the first to third exemplary embodiments can also be applied to the multi-sampling. While the number of times of AD conversion to be performed on one pixel signal is not specifically limited, an example in which the number of times is two is described here.

Furthermore, increasing the number of times of AD conversion to be performed on one pixel signal enables making an advantageous effect of preventing or reducing a random nose greater.

Figure 7A:
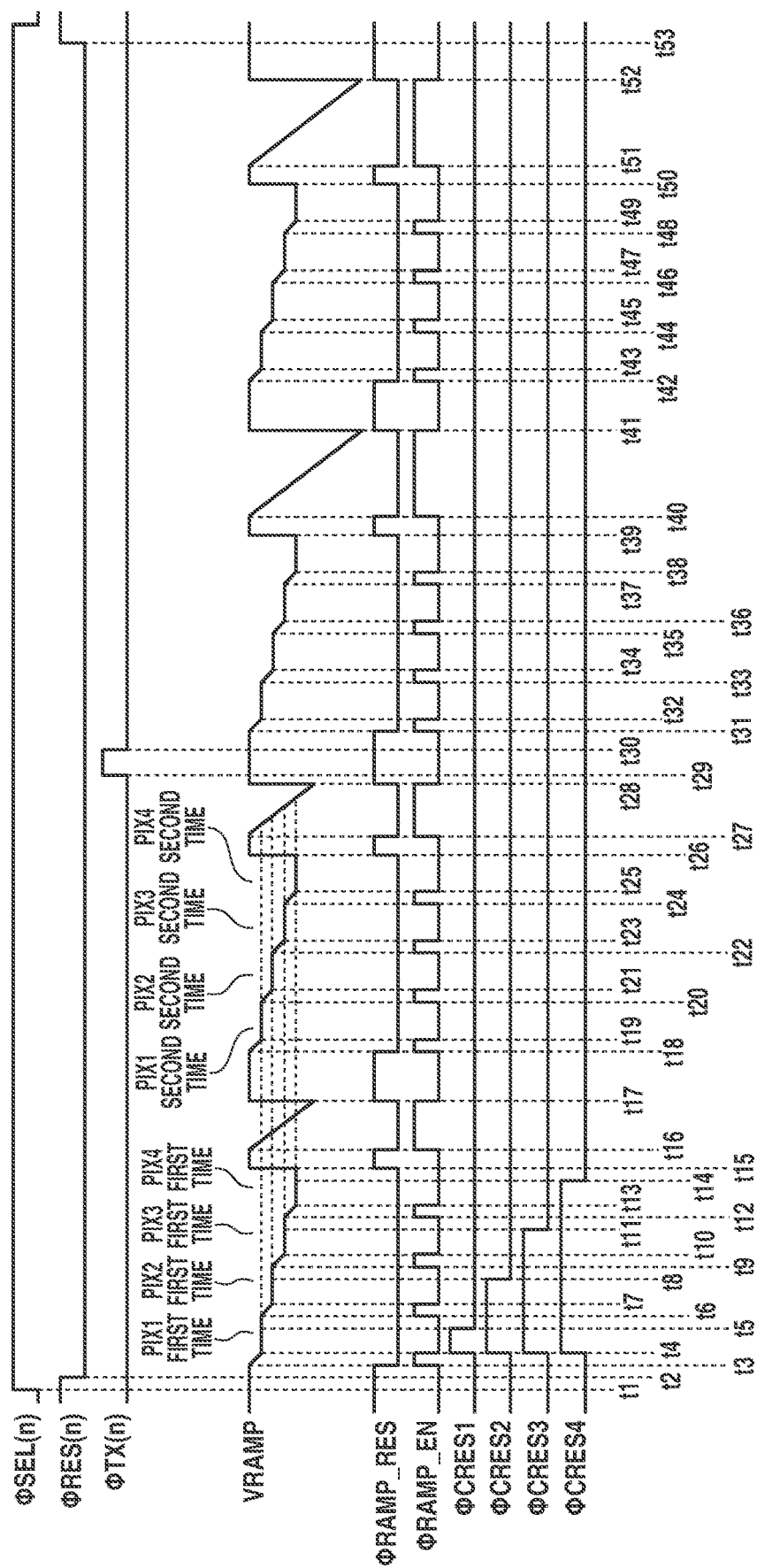
FIG. 7A is a diagram illustrating an operation of a photoelectric conversion device in a fourth exemplary embodiment.

FIG. 7A is a diagram illustrating an operation in the fourth exemplary embodiment.

In a period until time t2, the control signal ΦRES(n) becomes at high level and, thus, the reset transistor 204 is turned on, so that the floating diffusion (FD) 203 is reset to an electric potential that is based on the power source electric potential. After that, the control signal ΦRES(n) transitions to low level and, thus, the reset transistor 204 is turned off, so that resetting of the floating diffusion (FD) 203 is canceled.

Next, as with the driving sequence in a period from time t1 to time t15 illustrated in FIG. 3A in the first exemplary embodiment, in a period from time t3 to time t17, the timing generation circuit 60 outputs control signals to perform control.

With driving performed until here, respective noise signals (in the first time) obtained at time t16 to time t17 of pixel signals PIX1 to PIX4 are stored and retained in the memories 42 in the respective corresponding columns.

Next, only with regard to the control signals ΦRAMP_RES and ΦRAMP_EN, the timing generation circuit 60 repeats, in a period from time t18 to time t28, a driving sequence performed in a period from time t3 to time t17. With this driving, respective noise signals (in the second time) obtained at time t27 to time t28 of pixel signals PIX1 to PIX4 are stored and retained in the memories 42 in the respective corresponding columns.

Next, at time t29, the control signal ΦTX(n) transitions to high level and, thus, the transfer transistor 202 is turned on.

With this driving, a light signal is transferred to the floating diffusion (FD) 203, and the amplification transistor 205 outputs an amplified signal corresponding to the level of the floating diffusion (FD) 203 to the vertical output line 16 via the row selection transistor 206.

Next, in a period from time t31 to time t41, the timing generation circuit 60 outputs the same control signals as those in the driving sequence performed at time t18 to time t28 to repeat such a driving sequence. However, usually, in most cases, a period from time t40 to time t41 is longer than a period from time t27 to time t28.

With this driving, respective light signals (in the first time) obtained at time t40 to time t41 of pixel signals PIX1 to PIX4 are stored and retained in the memories 42 in the respective corresponding columns Next, the timing generation circuit 60 repeats, in a period from time t41 to time t52, a driving sequence performed in a period from time t28 to time t41. With this driving, respective light signals (in the second time) obtained at time t51 to time t52 of pixel signals PIX1 to PIX4 are stored and retained in the memories 42 in the respective corresponding columns.

Then, digital signals retained in the memories 42 are transferred to a processing circuit in the subsequent stage via the horizontal scanning circuit 50. After that, in the processing circuit in the subsequent stage, respective averages of light signals and pixel reset noise signals obtained two times and differing in AD conversion timing are obtained, and a difference between the averages of light signals and pixel reset noise signals is obtained, so that CDS of signals subjected to multi-sampling can be performed.

In this way, according to the fourth exemplary embodiment, performing AD multi-sampling, which performs AD conversion on the same pixel signal a plurality of times and sets, by, for example, a processing circuit in the subsequent stage, an average value of signals obtained by AD conversion performed a plurality of times as a final output value, enables preventing or reducing a random noise included in each signal.

Additionally, it is possible to generate a plurality of offset levels and cause the comparison circuits 32 to retain the plurality of offset levels, and it is possible to prevent or reduce the outputs of all of the comparison circuits 32 from being reversed at the same time. As a result, it is possible to reduce noises caused by ohmic drop (IR drop) or current fluctuation accompanied by the simultaneous reversal of outputs of the comparison circuits 32 and, eventually, improve image quality.

Additionally, a driving sequence similar to driving of the reference signal output circuit 36 which is performed before AD conversion of a noise signal is also performed before AD conversion of a light signal. This enables easily equalizing an electric potential obtained before resetting to a starting potential for AD conversion of a noise signal is performed to an electric potential obtained before resetting to a starting potential for AD conversion of a light signal is performed.

According to the fourth exemplary embodiment, driving sequences of the reference signal output circuit 36 which are performed before AD conversion of a noise signal and before AD conversion of a light signal are equalized to each other. This enables, even in a case where reset times for a ramp signal before AD conversion of a noise signal and before AD conversion of a light signal are not able to be sufficiently taken, easily equalizing a ramp starting potential for AD conversion of a noise signal and a ramp starting potential for AD conversion of a light signal to each other.

Therefore, even in the fourth exemplary embodiment, it is possible to obtain an advantageous effect similar to that in the first exemplary embodiment.

Moreover, in a case where, with respect to a signal in one pixel (one column), a plurality of comparison circuits 32 and a plurality of memories 42 are used, even if multi-sampling is performed, it is possible to prevent or reduce a random noise while preventing a decrease in readout speed.

An operation of a configuration in which two comparison circuits 32 and two memories 42 are able to be used for one pixel (one column) is described with reference to FIG. 7B.

In the configuration to be described with reference to FIG. 7B, a configuration of performing AD conversion on pixel signals PIX1 to PIX4 while changing offset levels of the comparison circuits 32, as in the above-described exemplary embodiments, is not employed. Reference signals are driven in such a way as to provide a first offset level and a second offset level, and the control signal ΦCRES1 and the control signal ΦCRES2 are set as respective signals (circuit connections) for controlling reset timings of the first comparison circuit 32 and the second comparison circuit 32. Additionally, the output for the pixel signal PIX1 (one pixel) is connected to both the first and second comparison circuits 32 via the vertical output line 16. Employing such a circuit configuration and driving method enables performing AD conversion on a reset noise signal for the pixel signal PIX1 two times at respective different timings corresponding to the first offset level and the second offset level (within a period from time t10 to time t11). Similarly, even with respect to a light signal, AD conversion is performed two times at respective different timings within a period from time t19 to time t20.

In this way, according to the fourth exemplary embodiment, AD conversion on the same pixel signal is performed a plurality of times, and an average value of signals obtained by AD conversion performed a plurality of times is obtained by a processing circuit in the subsequent stage. Performing this multi-sampling enables preventing or reducing a random noise included in each pixel signal.

Figure 7B:
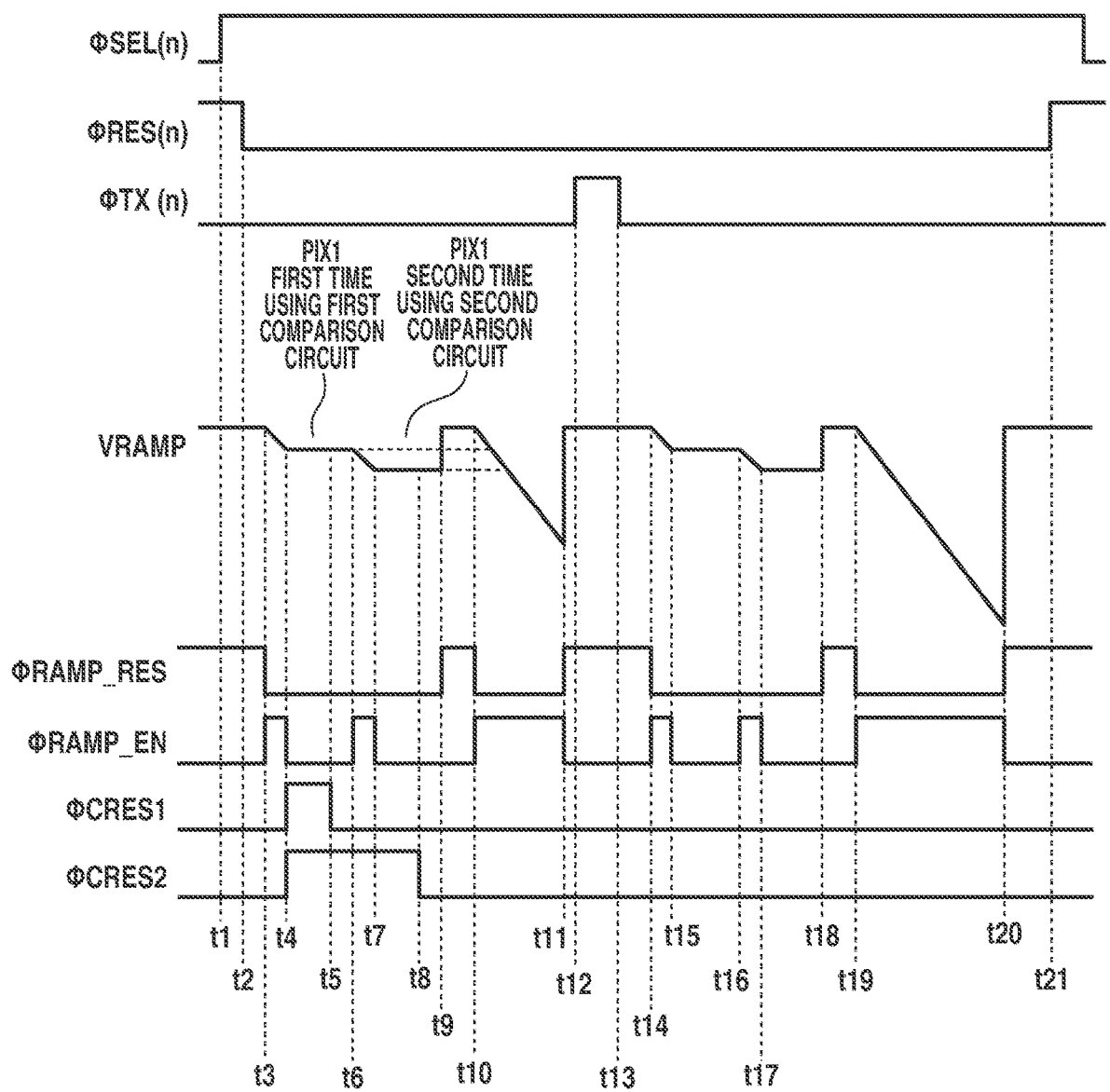
FIG. 7B is a diagram illustrating an operation of the photoelectric conversion device in the fourth exemplary embodiment.

Additionally, employing the configuration illustrated in FIG. 7B enables preventing or reducing an increase in readout time caused by performing AD multi-sampling, and thus enables preventing or reducing a decrease in frame rate of a photoelectric conversion element.

Additionally, a driving sequence similar to driving of the reference signal output circuit 36 which is performed before AD conversion of a noise signal is also performed before AD conversion of a light signal. This avoids an electric potential obtained before resetting to a starting potential for AD conversion of a noise signal is performed differing from an electric potential obtained before resetting to a starting potential for AD conversion of a light signal is performed.

According to the fourth exemplary embodiment, driving sequences of the reference signal output circuit 36 which are performed before AD conversion of a noise signal and before AD conversion of a light signal are equalized to each other. This enables, even in a case where reset times for a ramp signal before AD conversion of a noise signal and before AD conversion of a light signal are not able to be sufficiently taken, easily equalizing a ramp starting potential for AD conversion of a noise signal and a ramp starting potential for AD conversion of a light signal to each other.

With this configuration, even in the fourth exemplary embodiment, it is possible to obtain an advantageous effect similar to that in the first exemplary embodiment.

Furthermore, in the fourth exemplary embodiment, an example of multi-sampling in which two comparison circuits 32 and two memories 42 are allocated to one pixel has been described. This is merely an example, and the fourth exemplary embodiment is not limited to a driving method corresponding to two comparison circuits 32 and two memories 42. As far as an increase in column circuit and an increase in consumption current are allowed, the numbers of comparison circuits 32 and memories 42 to be allocated to one pixel can be increased.

A fifth exemplary embodiment is described with a focus on differences from the first exemplary embodiment.

The fifth exemplary embodiment relates to a technique of using an image generated by amplifying a signal of the same pixel 12 with respective different (AD conversion) gains and combining two signals of the pixel 12 in signal processing in the subsequent stage, thus implementing a high dynamic range while maintaining synchronism.

In a case where the inclination of a reference signal is small, since the amount of change of the reference signal per one clock signal of the counter becomes small, the resolution power of AD conversion increases.

Since this enables finely detecting a variation in electrical potential of the output line 16, the amplification rate (AD conversion gain) becomes high. On the other hand, in a case where the inclination of a reference signal is large, since the amount of change of the reference signal per one clock signal of the counter becomes large, the resolution power of AD conversion decreases. Since this lowers the accuracy of detection of a variation in electrical potential of the output line 16, the amplification rate (AD conversion gain) becomes low.

Figure 8:
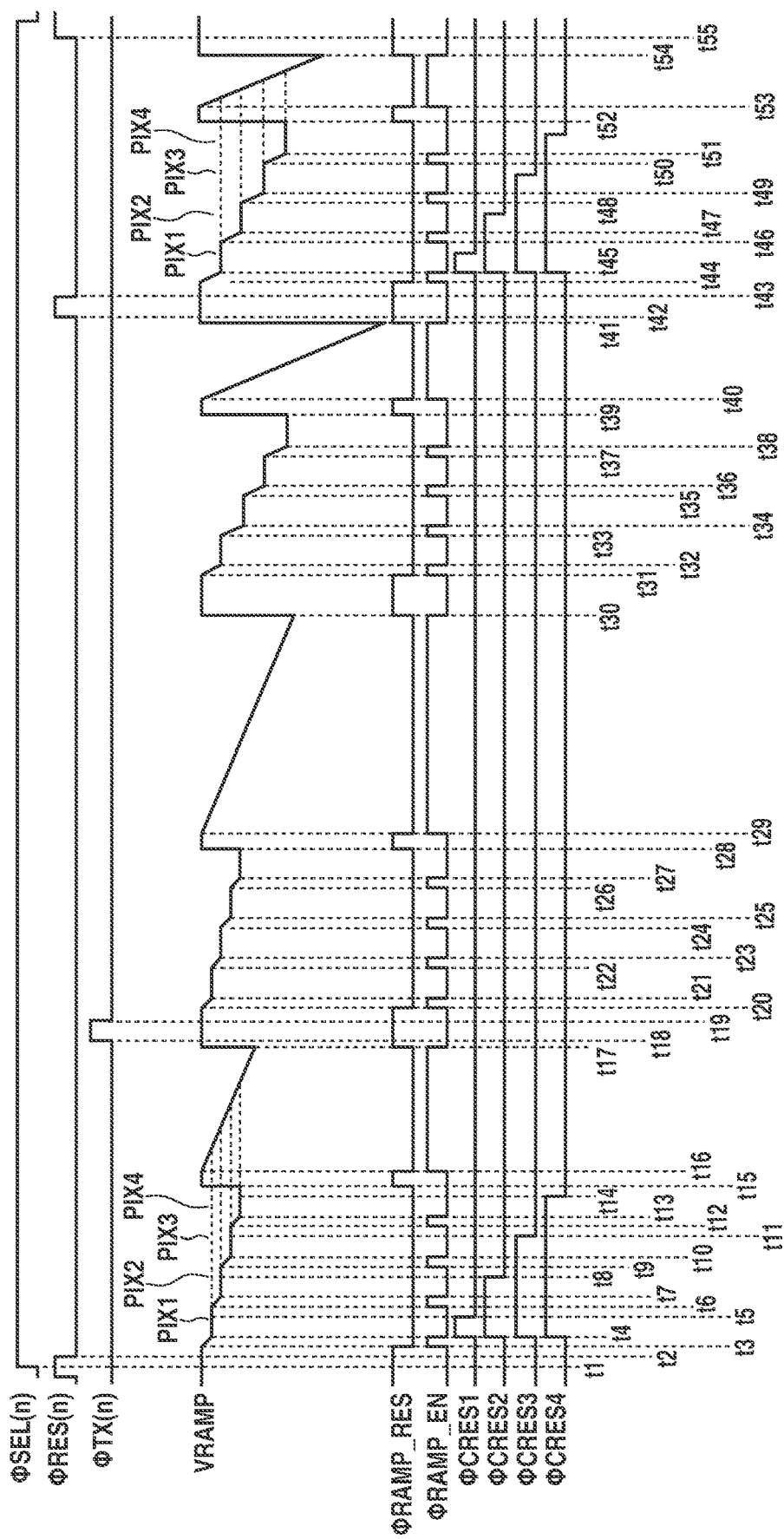
FIG. 8 is a diagram illustrating an operation of a photoelectric conversion device in a fifth exemplary embodiment.

FIG. 8 is a diagram illustrating an operation in the fifth exemplary embodiment.

A period from time t2 to time t17 is a readout period for a pixel reset noise signal amplified at a first amplification rate (a first noise signal). A period from time t18 to time t30 is a readout period for a light signal amplified at the first amplification rate (a first light signal). A period from time t30 to time t41 is a readout period for a light signal amplified at a second amplification rate (a second light signal). A period from time t42 to time t54 is a readout period for a pixel reset noise signal amplified at the second amplification rate (a second noise signal). In the fifth exemplary embodiment, readout of signals is performed in order of the first noise signal, the first light signal, the second light signal, and the second noise signal.

Furthermore, in the fifth exemplary embodiment, the first and second noise signals and the first and second light signals which are read out in the above-mentioned order are signals of one and the same pixel 12.

In a period until time t2, the control signal ΦRES(n) becomes at high level and, thus, the reset transistor 204 is turned on, so that the floating diffusion (FD) 203 is reset to an electric potential that is based on the power source electric potential. After that, the control signal ΦRES(n) transitions to low level and, thus, the reset transistor 204 is turned off, so that resetting of the floating diffusion (FD) 203 is canceled.

Next, as with the driving sequence in a period from time t1 to time t26 illustrated in FIG. 3A in the first exemplary embodiment, in a period from time t3 to time t30, the timing generation circuit 60 outputs control signals to perform control.

With driving performed until here, the first noise signal and the first light signal amplified at the first amplification rate are stored in the memory 42.

Next, the inclination of the reference signal of the reference signal output circuit 36 is changed so that the first amplification rate is switched to the second amplification rate.

While there is a difference in amplification rate, a driving sequence similar to that in a period from time t17 to time t30 is repeated in a period from time t30 to time t41.

Next, at time t42, the control signal ΦRES(n) becomes at high level and, thus, the reset transistor 204 is turned on, so that the floating diffusion (FD) 203 is reset to an electric potential that is based on the power source electric potential. After that, at time t43, the control signal ΦRES(n) transitions to low level and, thus, the reset transistor 204 is turned off, so that resetting of the floating diffusion (FD) 203 is canceled.

After that, while there is a difference in the inclination of the reference signal, a driving sequence similar to that in a period from time t3 to time t17 is repeated in a period from time t44 to time t51.

With driving performed until here, the second light signal and the second noise signal amplified at the second amplification rate are stored in the memory 42.

After this, in a processing circuit in the subsequent stage, processing for subtracting a digital value of the first noise signal from a digital value of the first light signal is performed, so that the result of subtraction is output as first digital data. Moreover, similarly, processing for subtracting a digital value of the second noise signal from a digital value of the second light signal is performed, so that the result of subtraction is output as second digital data.

In this way, in the fifth exemplary embodiment, a signal of the same pixel 12 is amplified at respective different (AD conversion) gains. Using an image generated by combining two signals of the pixel 12 in image processing in the subsequent stage enables implementing a high dynamic range while maintaining synchronism.

Additionally, it is possible to generate a plurality of offset levels and storing the plurality of offset levels in the comparison circuits 32, and thus to prevent or reduce the outputs of all of the comparison circuits 32 from being reversed at the same time. As a result, it is possible to reduce noises caused by ohmic drop (IR drop) or current fluctuation accompanied by the simultaneous reversal of outputs of the comparison circuits 32 and, eventually, improve image quality.

Additionally, a driving sequence similar to driving of the reference signal output circuit 36 which is performed before AD conversion of a noise signal is also performed before AD conversion of a light signal. This facilitates equalizing an electric potential obtained before resetting to a starting potential for AD conversion of a noise signal is performed to an electric potential obtained before resetting to a starting potential for AD conversion of a light signal is performed.

According to the fifth exemplary embodiment, driving sequences of the reference signal output circuit 36 which are performed before AD conversion of a noise signal and before AD conversion of a light signal are equalized to each other. This enables, even in a case where reset times for a ramp signal before AD conversion of a noise signal and before AD conversion of a light signal are not able to be sufficiently taken, easily equalizing a ramp starting potential for AD conversion of a noise signal and a ramp starting potential for AD conversion of a light signal to each other.

Therefore, even in the fifth exemplary embodiment, it is possible to obtain an advantageous effect similar to that in the first exemplary embodiment.

Furthermore, a noise signal to be superimposed on the second light signal obtained by amplifying a light signal at the second amplification rate is different from the second noise signal. However, a signal obtained by amplifying a light signal at the second amplification rate lower than the first amplification rate is, after being subjected to image combination in the subsequent stage, used mainly at the high-luminance side. Therefore, even if these noise signals are different from each other, since light shot noise is dominant and the influence on an image quality obtained after image combination is small, those are unlikely to become a problem.

Moreover, in the fifth exemplary embodiment, a driving sequence similar to the driving sequence of the reference signal output circuit 36 which is performed before AD conversion of the second noise signal is also performed before AD conversion of the second light signal. However, as far as a ramp driving sequence similar to that performed before AD conversion of the second noise signal is performed only before AD conversion of the first light signal, an advantageous effect described in the fifth exemplary embodiment is able to be obtained. The reason for this is similar to the above-mentioned reason, and, since a signal obtained by amplifying a light signal at the second amplification rate is, after being subjected to image combination in the subsequent stage, used mainly at the high-luminance side, even if these noise signals are different from each other, light shot noise is dominant and the influence on an image quality obtained after image combination is small, so that those are unlikely to become a problem.

Moreover, while, in the fifth exemplary embodiment, an example in which readout of signals is performed in order of the first noise signal, the first light signal, the second light signal, and the second noise signal has been described, this order can be changed to the order of the second noise signal, the first noise signal, the first light signal, and the second light signal. In this case, a resetting operation for the floating diffusion (FD) 203 which is performed by turning-on and turning-off control of the control signal ΦΦRES(n) at time t42 to time t43 becomes unnecessary, and a noise signal to be superimposed on the second light signal obtained by amplifying a light signal at the second amplification rate becomes equivalent to the second noise signal. Therefore, there is an advantageous effect in which CDS accuracy increases even in a high-luminance side image. In that configuration, a memory for storing the first noise signal and the second noise signal separately can be provided in the memory 42 or in a processing circuit in the subsequent stage.

Moreover, in a case where, as mentioned above as a modification example of the fourth exemplary embodiment, a plurality of comparison circuits is provided for one pixel, AD conversion operations differing in AD conversion gain (i.e., differing in the inclination of a ramp signal) can be performed in parallel with respect to each of the first noise signal and the second noise signal. Moreover, AD conversion operations differing in AD conversion gain (i.e., differing in the inclination of a ramp signal) can also be performed in parallel with respect to each of the first light signal and the second light signal.

Figure 9:
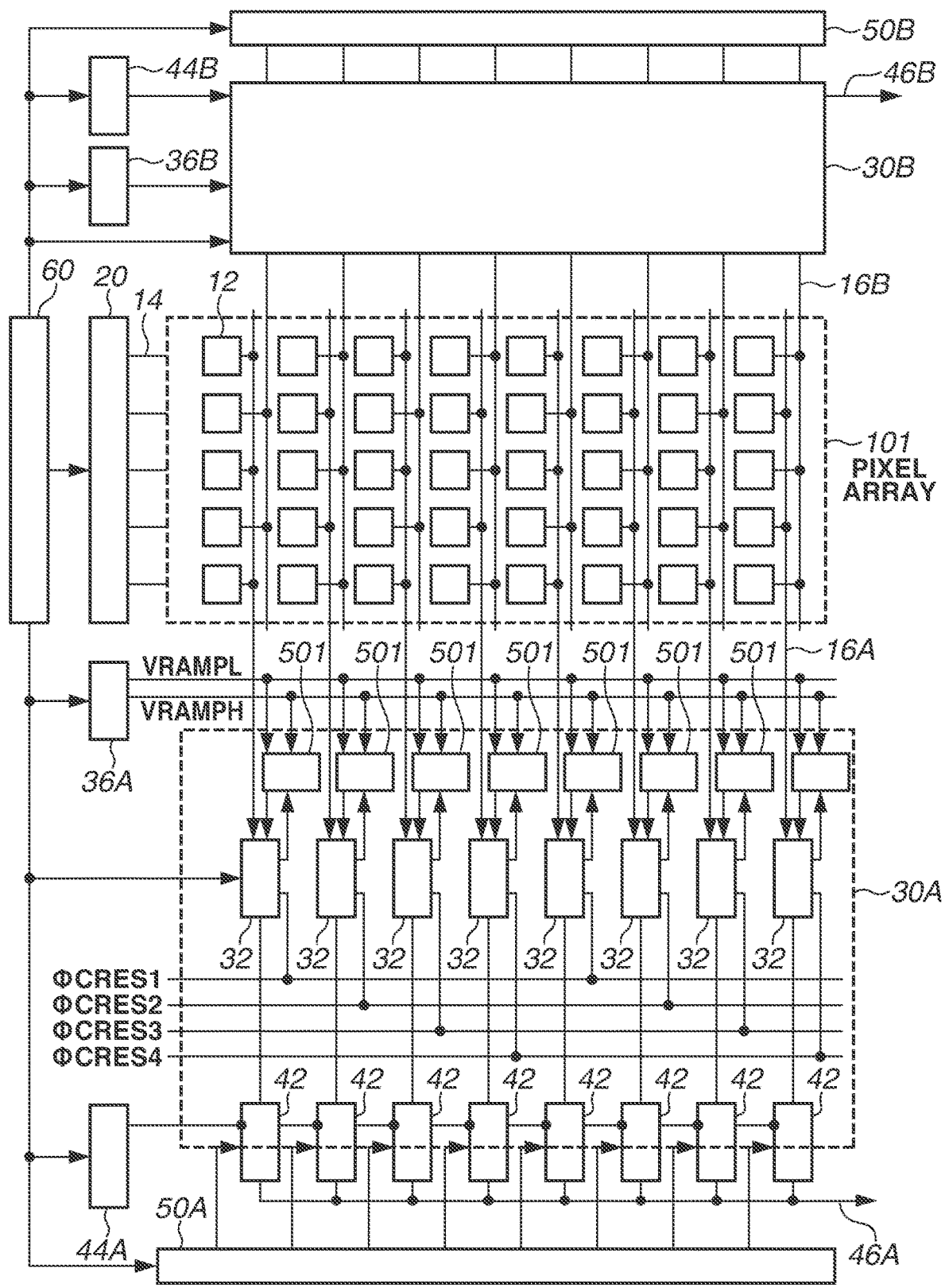
FIG. 9 is a diagram illustrating a configuration of a photoelectric conversion device in a sixth exemplary embodiment.

An outline configuration of a photoelectric conversion device according to a sixth exemplary embodiment is described with reference to FIG. 9. FIG. 9 is a block diagram illustrating an outline of the photoelectric conversion device according to the sixth exemplary embodiment.

In the sixth exemplary embodiment, in AD conversion of a light signal, a plurality of inclinations (the amounts of change in electric potential per unit time) of the reference signal is used, and different inclinations are used depending on the amount of light signal of each pixel. Thus, an AD conversion gain is changed based on a signal of each pixel. This relates to a technique of enabling shortening of an AD conversion period while preventing or reducing a decrease in effective AD resolution power.

Furthermore, portions overlapping those described in the first exemplary embodiment are omitted from description.

The photoelectric conversion device 100 according to the sixth exemplary embodiment further includes reference signal selection circuits 501 in addition to the elements included in the photoelectric conversion device illustrated in FIG. 1. Moreover, each of the reference signal output circuits 36A and 36B outputs ramp signals, i.e., reference signals VRAMPL and VRAMPH. The reference signals VRAMPL and VRAMPH are ramp signals differing in inclination (the amount of change in electric potential per unit time). The reference signal selection circuit 501 selects one of the reference signals VRAMPL and VRAMPH and outputs the selected ramp signal to the corresponding comparison circuit 32. Such selection of a ramp signal is performed based on a result of comparison performed by the comparison circuit 32 between a pixel signal and a determination threshold value.

Figure 10:
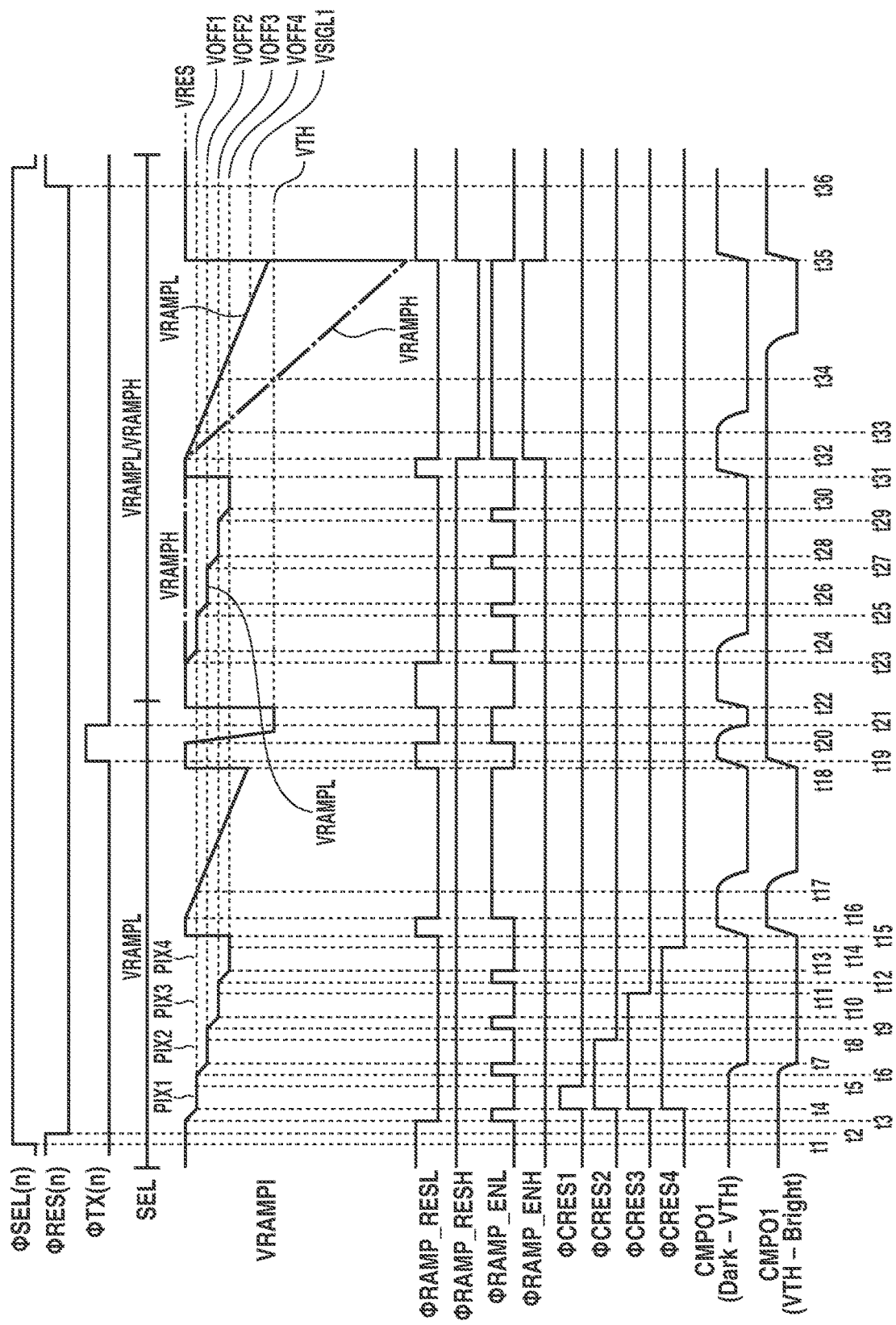
FIG. 10 is a diagram illustrating an operation of the photoelectric conversion device in the sixth exemplary embodiment.

FIG. 10 is a diagram used to explain a readout operation in the sixth exemplary embodiment. FIG. 10 illustrates a readout operation concerning pixels 12 arranged in one row out of pixels 12 arranged in a plurality of rows illustrated in FIG. 9. The pixels 12 arranged in one row include at least a first pixel 12 and a second pixel 12.

A reference signal VRAMPI illustrated in FIG. 10 is a reference signal which the reference signal selection circuit 501 outputs to the comparison circuit 32.

In FIG. 10, line SEL represents which of the reference signal VRAMPL and the reference signal VRAMPH the reference signal selection circuit 501 is selecting as a reference signal corresponding to the reference signal VRAMPI. Moreover, in FIG. 10, two types of outputs CMPO1 of the comparison circuit 32 are illustrated. The output CMPO1 (Dark–VTH) indicates a case where an image capturing target is dark, specifically, a case where an output signal from a pixel that is based on light incident on a photodiode (PD) is smaller than a difference (VTH–VOFF1) between a comparison level VTH and a reference level VOFF1 described below. The output CMPO1 (VTH–Bright) indicates a case where an image capturing target is bright, specifically, a case where an output signal from a pixel that is based on light incident on a photodiode (PD) is larger than the difference (VTH–VOFF1).

At time t1 to time t2, the control signal ΦRES(n) becomes at high level and, thus, the reset transistor 204 is turned on, so that the floating diffusion (FD) 203 is reset to an electric potential that is based on the power source electric potential.

After that, the control signal ΦRES(n) transitions to low level and, thus, the reset transistor 204 is turned off, so that resetting of the floating diffusion (FD) 203 is canceled. The amplification transistor 205 outputs a signal that is based on the electric potential of the floating diffusion (FD) 203 resetting of which has been canceled to the vertical output line 16 via the row selection transistor 206. The signal which is output at that time is referred to as an "N signal", and the electric potential level of the N signal is denoted by VN.

At time t1 to time t15, the reference signal selection circuit 501 is outputting the reference signal VRAMPL as the reference signal VRAMPI.

At time t3, the timing generation circuit 60 controls the control signal ΦRAMP_RESL to change from high level to low level. With this change, the reset state of the reference signal output circuit 36 is canceled.

Moreover, at the same time t3, the timing generation circuit 60 controls the control signal ΦRAMP_ENL to change from low level to high level. With this change, the voltage level of the reference signal VRAMPL, i.e., the reference signal VRAMPI, gradually varies (decreases) from the reference voltage level as time proceeds.

Next, at time t4, the timing generation circuit 60 controls the control signal ΦRAMP_ENL to change from high level to low level. With this change, the voltage level of the reference signal VRAMPL, i.e., the reference signal VRAMPI, becomes not changing, so that the reference signal VRAMPI becomes kept constant at a first voltage level lower than the reference voltage level. The electric potential obtained at that time is referred to as an "offset level VOFF1". At time t5, the timing generation circuit 60 controls the control signal ΦCRES1 to change from high level to low level. With this change, the comparison circuit 32 in a column to which the control signal ΦCRES1 is supplied performs a clamping (auto-zero) operation for taking in a pixel reset noise signal based on the offset level VOFF1.

Next, at time t6, the timing generation circuit 60 controls the control signal ΦRAMP_ENL to change from low level to high level. With this change, the voltage level of the reference signal VRAMPL, i.e., the reference signal VRAMPI, gradually varies (decreases) from the first voltage level as time proceeds.

Next, at time t7, the timing generation circuit 60 controls the control signal ΦRAMP_ENL to change from high level to low level. With this change, the voltage level of the reference signal VRAMPL, i.e., the reference signal VRAMPI, becomes not changing, so that the reference signal VRAMPL becomes kept constant at a second voltage level lower than the first voltage level. The electric potential obtained at that time is referred to as an "offset level VOFF2". At time t8, the timing generation circuit 60 controls the control signal ΦCRES2 to change from high level to low level. With this change, the comparison circuit 32 in a column to which the control signal ΦCRES2 is supplied performs a clamping (auto-zero) operation for taking in a pixel reset noise signal based on the offset level VOFF2.

Next, at time t9, the timing generation circuit 60 controls the control signal ΦRAMP_ENL to change from low level to high level. With this change, the voltage level of the reference signal VRAMPL, i.e., the reference signal VRAMPI, gradually varies (decreases) from the second voltage level as time proceeds.

Next, at time t10, the timing generation circuit 60 controls the control signal ΦRAMP_ENL to change from high level to low level. With this change, the voltage level of the reference signal VRAMPL, i.e., the reference signal VRAMPI, becomes not changing, so that the reference signal VRAMPI becomes kept constant at a third voltage level lower than the second voltage level. The electric potential obtained at that time is referred to as an "offset level VOFF3". At time t11, the timing generation circuit 60 controls the control signal ΦCRES3 to change from high level to low level. With this change, the comparison circuit 32 in a column to which the control signal ΦCRES3 is supplied performs a clamping (auto-zero) operation for taking in a pixel reset noise signal based on the offset level VOFF3.

Next, at time t12, the timing generation circuit 60 controls the control signal ΦRAMP_ENL to change from low level to high level. With this change, the voltage level of the reference signal VRAMPL, i.e., the reference signal VRAMPI, gradually varies (decreases) from the third voltage level as time proceeds.

Next, at time t13, the timing generation circuit 60 controls the control signal ΦRAMP_ENL to change from high level to low level. With this change, the voltage level of the reference signal VRAMPL, i.e., the reference signal VRAMPI, becomes not changing, so that the reference signal VRAMPI becomes kept constant at a fourth voltage level lower than the third voltage level. The electric potential obtained at that time is referred to as an "offset level VOFF4". At time t14, the timing generation circuit 60 controls the control signal ΦCRES4 to change from high level to low level. With this change, the comparison circuit 32 in a column to which the control signal ΦCRES4 is supplied performs a clamping (auto-zero) operation for taking in a pixel reset noise signal based on the offset level VOFF4.

Next, at time t15, the timing generation circuit 60 controls the control signal ΦRAMP_RESL to change from low level to high level. With this change, the reference signal output circuit 36 enters into a reset state, so that the voltage level of the reference signal VRAMPI returns to the reference voltage level.

Then, the output CMPO1 becomes at high level. Whether, at this time, the output CMPO1 becomes at high level or low level depends on a configuration of the comparison circuit 32. In the sixth exemplary embodiment, the following description is based on the assumption that the output CMPO1 becomes at high level.

In a period from time t16 to time t18, AD conversion in the first time is performed.

At time t16, the timing generation circuit 60 controls the control signal ΦRAMP_RESL to change from high level to low level.

At the same time t16, the timing generation circuit 60 controls the control signal ΦRAMP_ENL to change from low level to high level. With this change, the voltage level of the reference signal VRAMPL, i.e., the reference signal VRAMPI, gradually varies (decreases) from the reference voltage level as time proceeds.

Moreover, counting by the counter 44 is started. When, at time t17, the electric potential of the reference signal VRAMPI reaches an offset level VOFF1, the magnitude relationship between two input signal levels VRAMPI and VIN of the comparison circuit 32 in a column of the pixel PIX1 inverts, so that the output CMPO1 changes to low level. In response to such a change of the output CMPO1 at that time serving as a trigger, the memory 42 takes in a counted value obtained at that time as a digital signal. The digital signal obtained at that time is referred to as an "N1 signal".

After that, the same applies to times when the electric potential of the reference signal VRAMPI has reached respective offset levels VOFF2 to VOFF4. The digital signals obtained at the respective times are referred to as an "N2 signal" to an "N4 signal".

At time t18, in response to the control signal ΦRAMP_RESL becoming at high level and the enable signal ΦRAMP_ENL becoming at low level, the reference signal VRAMPL is reset, so that the output CMPO1 becomes at high level.

At time t19 to time t20, the control signal DTX(n) becomes at high level and, thus, the pixel transfer transistor 202 is turned on, so that an electric charge accumulated in the photodiode (PD) 201 is transferred to the floating diffusion (HD) 203. The amplification transistor 205 outputs a signal that is based on the electric potential of the floating diffusion (FD) 203 to the vertical output line 16 via the row selection transistor 206. The signal which the amplification transistor 205 outputs to the vertical output line 16 is referred to as a "light signal", and the electric potential level of the light signal is denoted by VS. The light signal is a signal generated by photoelectric conversion in the pixel 12.

During this period, the node VRAMPI outputs a comparison electric potential level (comparison level) VTH for making a comparison with the magnitude of a light signal. As a method for implementing the comparison level VTH, for example, a current source for comparison level generation (not illustrated) is connected to the node VRAMPL and, during this period, a large current is caused to flow to the node VRAMPL. A case where the amount of change from the electric potential level of a reset noise signal to the electric potential level of a light signal (VS−VN) is smaller than each of differences between the comparison level VTH (determination threshold value) and the respective reference levels VOFF1 to VOFF4 (VTH−VOFF1 to VOFF4), i.e., a case "(Dark−VTH)", is described. In this case, each of the outputs CMPO1 to CMPO4 is at low level. On the other hand, a case where the amount of change (VS−VN) is larger than each of differences between the comparison level VTH and the respective reference levels VOFF1 to VOFF4 (VTH−VOFF1 to VOFF4), i.e., a case "(VTH−Bright)", is described. In this case, each of the outputs CMPO1 to CMPO4 is at high level. This comparison operation is performed for every column, and results of the comparison operation performed for every column are stored in the memories 42. Thus, results of the comparison operation indicating whether each of the outputs CMPO1 to CMPO4 is at high level or low level are input to the memories 42. Such results of the comparison operation are also input to the reference signal selection circuits 501.

It is favorable that the comparison level VTH is set lower than a level at the end of a change of the electric potential of the reference signal VRAMPL. This configuration enables performing comparison processing for a signal output from each pixel with use of any one of the reference signals VRAMPL and VRAMPH.

At time t22 to time t23, the reference signal selection circuit 501 selects the signal VRAMPI to be output therefrom, according to a result of the comparison operation. In a case where the amplitude of a signal output from the pixel is less than or equal to a predetermined value, the reference signal selection circuit 501 selects the reference signal VRAMPL as the signal VRAMPI, and, in a case where the amplitude of a signal output from the pixel exceeds the predetermined value, the reference signal selection circuit 501 selects the reference signal VRAMPH as the signal VRAMPI. Thus, in a case where each of the outputs CMPO1 to CMPO4 is at low level, the reference signal selection circuit 501 outputs the reference signal VRAMPL as the signal VRAMPI, and, in a case where each of the outputs CMPO1 to CMPO4 is at high level, the reference signal selection circuit 501 outputs the reference signal VRAMPH as the signal VRAMPI. The reference signal selection circuit 501 selects and outputs one of the ramp signals VRAMPH and VRAMPL, which differ in inclination, according to a difference between the comparison level VTH and each of the reference levels VOFF1 to VOFF4.

Next, at time t23, the timing generation circuit 60 controls the control signal ΦRAMP_RESL to change from high level to low level. With this change, the reset state of the reference signal output circuit 36 is canceled.

Moreover, at the same time t23, the timing generation circuit 60 controls the control signal ΦRAMP_ENL to change from low level to high level. With this change, the voltage level of the reference signal VRAMPL gradually varies (decreases) from the reference voltage level as time proceeds.

Next, at time t24, the timing generation circuit 60 controls the control signal ΦRAMP_ENL to change from high level to low level. With this change, the voltage level of the reference signal VRAMPL becomes not changing, so that the reference signal VRAMPL becomes kept constant at the first voltage level lower than the reference voltage level.

Next, at time t25, the timing generation circuit 60 controls the control signal ΦRAMP_ENL to change from low level to high level. With this change, the voltage level of the reference signal VRAMPL gradually varies (decreases) from the first voltage level as time proceeds. (a fourth operation)

Next, at time t26, the timing generation circuit 60 controls the control signal ΦRAMP_ENL to change from high level to low level. With this change, the voltage level of the reference signal VRAMPL becomes not changing, so that the reference signal VRAMPL becomes kept constant at the second voltage level lower than the first voltage level.

Next, at time t27, the timing generation circuit 60 controls the control signal ΦRAMP_ENL to change from low level to high level. With this change, the voltage level of the reference signal VRAMPL gradually varies (decreases) from the second voltage level as time proceeds.

Next, at time t28, the timing generation circuit 60 controls the control signal ΦRAMP_ENL to change from high level to low level. With this change, the voltage level of the reference signal VRAMPL becomes not changing, so that the reference signal VRAMPL becomes kept constant at the third voltage level lower than the second voltage level.

Next, at time t29, the timing generation circuit 60 controls the control signal ΦRAMP_ENL to change from low level to high level. With this change, the voltage level of the reference signal VRAMPL gradually varies (decreases) from the third voltage level as time proceeds.

Next, at time t30, the timing generation circuit 60 controls the control signal ΦRAMP_ENL to change from high level to low level. With this change, the voltage level of the reference signal VRAMPL becomes not changing, so that the reference signal VRAMPL becomes kept constant at the fourth voltage level lower than the third voltage level.

Next, at time t31, the timing generation circuit 60 controls the control signal ΦRAMP_RESL to change from low level to high level. With this change, the reference signal output circuit 36 enters into a reset state, so that the voltage level of the reference signal VRAMPL returns to the reference voltage level.

Immediately before time t32, the enable signals ΦRAMP_ENL and ΦRAMP_ENH become at high level, so that preparations for an AD conversion operation in the second time described below are made.

At time t32 to time t34, AD conversion in the second time is performed.

From here, a case where a result of the comparison operation is "low level" (Dark−VTH) and a case where a result of the comparison operation is "high level" (VTH−Bright) are described separately.

The case where a result of the comparison operation is "low level" (Dark−VTH) is, for example, a case where the comparison operation is performed on a signal output from a first pixel in which no signal enters the photodiode (PD)

201 or the amount of light entering the photodiode (PD) 201 is less than or equal to a predetermined value.

In an example of the output CMPO1 illustrated in FIG. 10, a light signal in the vertical output line 16 to which the corresponding pixel is connected is the same in level as a reset noise signal. Accordingly, the output CMPO1 is inverted to low level at time t33, at which the electric potential of the ramp signal VRAMPL reaches each reference level VOFF1, in other words, the amount of change of the electric potential of the reference signal VRAMPL reaches each difference "(VRES−VOFF1)". A case where the amount of change of the pixel signal "(VS−VN)" is an amplitude greater than the difference "(VRES−VOFF1)" and less than a difference "(VTH−VOFF1)" is described. The output CMPO1 is inverted to low level at timing of any one of times t33 to t35 at which the ramp signal VRAMPL reaches a value "(VRES−(VS−VN)−VOFF1)". At this time, as the light signal is brighter, the output CMPO1 is inverted to low level at a later time. In response to such a change of the output CMPO1 at that time serving as a trigger, the memory 42 takes in a counted value obtained at that time as a digital signal. The digital signal obtained at that time is referred to as an "SADL signal".

The case where a result of the comparison operation is "high level" (VTH−Bright) is, for example, a case where the comparison operation is performed on a signal output from a second pixel in which the amount of light entering the photodiode (PD) 201 exceeds the predetermined value. The case of a bright column in which, when a result of the comparison operation is "high level", the amount of change of the pixel signal "(VS−VN)" in the vertical output line 16 to which the corresponding pixel is connected has an amplitude equivalent to the difference "(VTH−VOFF1)" is described. The output CMPO1 is inverted to low level at time t34, at which the electric potential of the ramp signal VRAMPH reaches a difference "(VRES−VTH)". While an exception may occur by, for example, the influence of noise, ordinarily, in a case where the ramp signal VRAMPH is selected, the amount of change of the pixel signal "(VS−VN)" is larger than the difference "(VTH−VOFF1)", inversion of the output CMPO1 does not occur before time t34. As the amount of change of the pixel signal "(VS−VN)" is larger, the output CMPO1 is inverted to low level later than time t34. In response to such a change of the output CMPO1 at that time serving as a trigger, the memory 42 takes in a counted value obtained at that time as a digital signal. The digital signal obtained at that time is referred to as an "SADH signal".

At time t35, the control signals ΦRAMP_RESL and ΦRAMP_RESH become at high level and the enable signals ΦRAMP_ENL and ΦRAMP_ENH become at low level, so that the reference signals VRAMPL and VRAMPH are reset and, thus, the output CMPO1 becomes at high level.

At time t34 and subsequent times, the NAD signal and the SADL signal or SADH signal, which are digital signals, and a result of the comparison operation are output from the memory 42 to a signal processing circuit in the subsequent stage, so that CDS processing is performed therein.

Next, an outline of the CDS processing which is performed in the signal processing circuit in the subsequent stage is described. In the present exemplary embodiment, since AD conversion processing is performed with use of two reference signals VRAMPL and VRAMPH, the inclination ratio of which is 1:4, an AD conversion gain of AD conversion performed with use of the reference signal VRAMPL is four times larger than that with use of the reference signal VRAMPH. Accordingly, after the respective AD conversion gains are equalized to each other, the following CDS processing is performed. In the case of a result of the comparison operation being "low level": SADL−NAD In the case of a result of the comparison operation being "high level": 4×SADH−NAD Moreover, correction processing is also performed in the signal processing circuit in the subsequent stage. An outline thereof is as follows.

In combining AD conversion results obtained with use of the reference signals

VRAMPL and VRAMPH, to maintain linearity, two correction processing operations are performed. The two correction processing operations include inclination correction, which corrects an error from an ideal inclination ratio (in the present exemplary embodiment, 1:4) between the ramp signals VRAMPL and VRAMPH, and level difference correction, which corrects a level difference occurring in the vicinity of values "(VTH−VOFF1 to VOFF4)", which are levels at which selection of a ramp signal is switched.

$$SADH = S(RAMPH)/S(RAMPL)/f(\text{counter}),$$

where S(RAMPH) denotes an inclination of the reference signal VRAMPH, S(RAMPL) denotes an inclination of the reference signal VRAMPL, and f(counter) denotes a count frequency of the counter 44.

In this way, according to the sixth exemplary embodiment, two types of inclinations of reference signals are prepared, and such two types of inclinations are separately used depending on the amount of incident light for every pixel. This enables attaining high-speed AD conversion and signal readout without decreasing an effective digital signal resolving power for signals which the photoelectric conversion device finally outputs.

Additionally, according to the sixth exemplary embodiment, driving sequences of the reference signal output circuit 36 which are performed before AD conversion of a noise signal and before AD conversion of a light signal at the time of darkness and at the time of low illuminance, in which AD conversion is performed with use of the reference signal VRAMPL, are equalized to each other. This enables, even in a case where reset times for a ramp signal before AD conversion of a noise signal and before AD conversion of a light signal are not able to be sufficiently taken, easily equalizing a ramp starting potential for AD conversion of a noise signal and a ramp starting potential for AD conversion of a light signal at the time of darkness and at the time of low illuminance to each other.

Therefore, even in the sixth exemplary embodiment, it is possible to obtain an advantageous effect similar to that in the first exemplary embodiment.

Furthermore, in the sixth exemplary embodiment, the control signal ΦRAMP_RESH is kept at high level until time t32. Accordingly, in the reference signal VRAMPH, driving sequences of the reference signal output circuit 36 which are performed before AD conversion of a pixel reset noise signal and before AD conversion of a light signal at the time of high illuminance greater than or equal to the value "(VTH−VOFF)" are not equalized to each other.

However, that is unlikely to be a trouble with regard to an image quality for the actual photoelectric conversion device. A noise caused by such a driving sequence is not a gain-based noise (a type of noise which becomes larger in proportion to the magnitude of a light signal) but an offset-based noise, so that, at the time of high illuminance, the noise becomes small relative to the light signal. Moreover, naturally, at the time of high illuminance, there exists a light shot noise, so that the light shot noise is larger than the amount of noise occurring in the above-mentioned issues.

For the above-mentioned two reasons, with regard to the reference signal VRAMPH, even in control performed in the sixth exemplary embodiment, a noise caused by a CDS error is unlikely to be visually recognized and is, thus, unlikely to be a problem.

Furthermore, control of the reference signal VRAMPH can be performed in the way similar to control of the reference signal VRAMPL. In this case, for example, the reference signal VRAMPH is controlled to be output as the signal VRAMPI between time t18 and time t19, and, during that period, the enable signal ΦRAMP_ENH is controlled in the way similar to the enable signal ΦRAMP_ENL between time t3 and time t18. At that time, values of the N1 signal to the N4 signal obtained when the reference signal VRAMPH is output as the signal VRAMPI are also caused to be separately stored in the memory 42. Additionally, at time t23 and subsequent times, the enable signal ΦRAMP_ENH is controlled in the way similar to the enable signal ΦRAMP_ENL. With this control, employing the N1 signal to the N4 signal as the NAD signal with respect to pixels for which the reference signal VRAMPH at the high illuminance side has been selected enables obtaining an advantageous effect of the sixth exemplary embodiment even with respect to signals at the high illuminance side.

Figure 12:
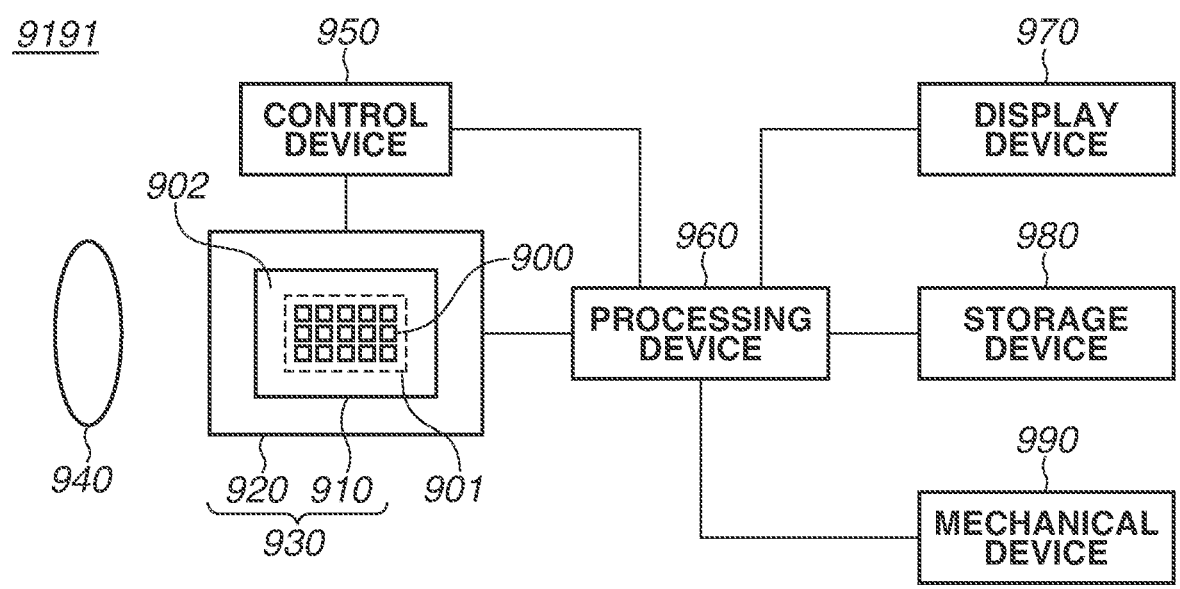
FIG. 12 is a diagram illustrating a configuration of an apparatus in a seventh exemplary embodiment.

A seventh exemplary embodiment is applicable to any one of the first to sixth exemplary embodiments. FIG. 12 is a schematic diagram used to explain an apparatus 9191 including a photoelectric conversion device 930 according to the seventh exemplary embodiment. The apparatus 9191 including the photoelectric conversion device 930 is described in detail. The photoelectric conversion device 930 can include, in addition to a semiconductor device 910 including the pixel arrays 10 as mentioned above, a package 920, which contains the semiconductor device 910. The package 920 can include a substrate to which the semiconductor device 910 is fixed and a cover body such as a glass member which is located opposite to the semiconductor device 910. The package 920 can further include a joining member, such as a bonding wire or bump, which interconnects a terminal provided in the substrate and a terminal provided in the semiconductor device 910.

The apparatus 9191 can include at least one of an optical device or circuit 940, a control device or circuit 950, a processing device or circuit 960, a display device 970, a storage device or circuit 980, and a mechanical device or assembly 990. The optical device 940 is located at a position opposite to the photoelectric conversion device 930. The optical device 940 includes, for example, a lens, a shutter, and a mirror. The control device 950 controls the photoelectric conversion device 930. The control device 950 is a semiconductor device such as an application specific integrated circuit (ASIC).

The processing device 960 processes a signal output from the photoelectric conversion device 930. The processing device 960 is a semiconductor device, such as a central processing unit (CPU) or an ASIC, which constitutes an analog front-end (AFE) or a digital front-end (DFB). The display device 970 is an electroluminescence (EL) display device or a liquid crystal display device, which displays information (image) obtained by the photoelectric conversion device 930.

The storage device 980 is a magnetic device or a semiconductor device, which stores information (image) obtained by the photoelectric conversion device 930. The storage device 980 is a volatile memory, such as a static random access memory (SRAM) or a dynamic random access memory (DRAM), or a non-volatile memory, such as a flash memory or a hard disk drive.

The mechanical device 990 includes a moving element or a propulsion element, such as a motor or an engine. In the apparatus 9191, a signal output from the photoelectric conversion device 930 is displayed on the display device 970 or is transmitted to the outside by a communication device (not illustrated) included in the apparatus 9191. Therefore, it is favorable that the apparatus 9191 further includes, separately from a storage circuit or an arithmetic circuit included in the photoelectric conversion device 930, the storage device 980 or the processing device 960. The mechanical device 990 can be controlled based on a signal output from the photoelectric conversion device 930.

Moreover, the apparatus 9191 is suitable for an electronic apparatus, such as an information terminal having an image capturing function (for example, a smartphone or a wearable terminal) or a camera (for example, a lens-interchangeable camera, a compact camera, a video camera, or a monitoring camera). The mechanical device 990 included in the camera is able to drive components of the optical device 940 for zooming, focusing, and shutter operations. Alternatively, the mechanical device 990 included in the camera is able to move the photoelectric conversion device 930 for an image stabilizing operation.

Moreover, the apparatus 9191 can be transport equipment, such as a vehicle, a ship or boat, or a flight vehicle. The mechanical device 990 included in the transport equipment can be used as a moving apparatus. The apparatus 9191 serving as transport equipment is suitable for an apparatus which transports the photoelectric conversion device 930 or an apparatus which performs assistance of driving (handling) and/or autonomous operation with use of an image capturing function. The processing device 960 for use in assistance of running (driving) and/or autonomous operation is able to perform processing for operating the mechanical device 990 serving as a moving apparatus based on information obtained by the photoelectric conversion device 930. Alternatively, the apparatus 9191 can be medical equipment, such as an endoscope, measuring equipment, such as a distance measuring sensor, analytical equipment, such as an electron microscope, business equipment, such as a copying machine, or industrial equipment, such as a robot.

According to each of the above-described exemplary embodiments, it becomes possible to obtain good pixel characteristics. Accordingly, it is possible to increase the value of the photoelectric conversion device. Increasing the value mentioned here corresponds to at least one of addition of a function, improvement of performance, improvement of characteristics, improvement of reliability, improvement of fabrication yield, reduction of environmental load, reduction in cost, reduction in size, and reduction in weight.

Accordingly, if the photoelectric conversion device 930 according to the seventh exemplary embodiment is used for the apparatus 9191, it is also possible to increase the value of the apparatus 9191. For example, if the photoelectric conversion device 930 is mounted on transport equipment, it is possible to obtain an excellent performance in performing image capturing of the surroundings of the transport equipment or measurement of the external environment thereof. Therefore, in the conduct of manufacturing and selling of the transport equipment, determining to mount, on the transport equipment, the photoelectric conversion device 930 according to the seventh exemplary embodiment is advantageous for increasing the performance of the transport equipment itself. Particularly, the photoelectric conversion device 930 is suitable for transport equipment which performs drive assist and/or autonomous driving of the transport equipment with use of information obtained by the photoelectric conversion device 930.

The above-described exemplary embodiments can be modified or altered as appropriate within a range which does not depart from the technical idea. Furthermore, the disclosure content of the present specification includes not only contents described in the present specification but also all of the particulars derivable from the present specification and the drawings accompanied by the present specification. Moreover, the disclosure content of the present specification includes the complement of a concept described in the present specification. Thus, if, in the present specification, for example, there is a description indicating that "A is larger than B", even if a description indicating that "A is not larger than B" is omitted, it can be said that the present specification also discloses that "A is not larger than B". This is because, in a case where there is a description indicating that "A is larger than B", it is premised that a case where "A is not larger than B" is taken into consideration.

According to the present disclosure, it is possible to improve AD conversion accuracy in performing AD conversion of each of a plurality of analog signals.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2021-076754 filed Apr. 28, 2021, which is hereby incorporated by reference herein in its entirety.

What is claimed is:

1. A driving method for an analog-to-digital (AD) conversion circuit including a plurality of comparison circuits each including a first terminal to which a plurality of analog signals including a first analog signal and a second analog signal is input and a second terminal connected to a wiring through which a ramp signal is transmitted, the driving method comprising:
a first operation of changing an electric potential of the wiring from a predetermined electric potential to a first electric potential to cause at least one comparison circuit of the plurality of comparison circuits to retain a first offset;
a second operation of, after the first operation, converting the first analog signal into a digital signal using the ramp signal where a change start electric potential of the ramp signal is a second electric potential and a change end electric potential of the ramp signal is a third electric potential, and a range between the second electric potential and the third electric potential is a range which satisfies a condition where the range between the predetermined electric potential and the first electric potential is in the range between the second electric potential and the third electric potential;
a third operation of, after the second operation, changing the electric potential of the wiring to an electric potential included in a range of from the predetermined electric potential to the first electric potential; and
a fourth operation of, after the third operation, converting the second analog signal into a digital signal using the ramp signal where another change end electric potential of the ramp signal is a fourth electric potential which is a potential that satisfies a condition where the third electric potential is between the second electric potential and the fourth electric potential.

2. The driving method for the AD conversion circuit according to claim 1, further comprising an operation of, before the first operation, changing the electric potential of the wiring to the second electric potential between the predetermined electric potential and the first electric potential to cause at least one other comparison circuits of the plurality of comparison circuits to retain a second offset different from the first offset.

3. The driving method for the AD conversion circuit according to claim 2, further comprising a fifth operation of, after the second operation and before the third operation, changing the electric potential of the wiring from the predetermined electric potential to the second electric potential,
wherein the third operation is an operation of changing the electric potential of the wiring from the second electric potential to the first electric potential.

4. The driving method for the AD conversion circuit according to claim 2, wherein the electric potential of the wiring changes in a slope fashion from the predetermined electric potential to the first electric potential via the second electric potential.

5. The driving method for the AD conversion circuit according to claim 2, wherein the electric potential of the wiring changes in a staircase fashion from the predetermined electric potential to the first electric potential via the second electric potential.

6. The driving method for the AD conversion circuit according to claim 2,
wherein an output circuit which outputs the ramp signal is connected to the AD conversion circuit, and
wherein the output circuit outputs the predetermined electric potential, the first electric potential, and the second electric potential to the wiring.

7. The driving method for the AD conversion circuit according to claim 1, wherein, in the second operation, the ramp signal sets the predetermined electric potential as a ramp starting potential and the electric potential of the wiring changes in excess of the first electric potential.

8. The driving method for the AD conversion circuit according to claim 7, wherein, in the third operation, the ramp signal sets the predetermined electric potential as the ramp starting potential and the electric potential of the wiring changes in excess of the first electric potential.

9. The driving method for the AD conversion circuit according to claim 1,
wherein, in the second operation, the ramp signal sets the third electric potential different from the predetermined electric potential as a ramp starting potential to change the electric potential of the wiring, and
wherein the first operation is an operation of, after changing the electric potential of the wiring from the third electric potential to the predetermined electric potential, changing the electric potential of the wiring to the first electric potential.

10. The driving method for the AD conversion circuit according to claim 2,
wherein, in the second operation, the ramp signal sets the third electric potential different from the predetermined electric potential as a ramp starting potential to change the electric potential of the wiring, and
wherein the first operation is an operation of, after changing the electric potential of the wiring from the third electric potential to the predetermined electric potential, changing the electric potential of the wiring to the first electric potential.

11. An analog-to-digital (AD) conversion circuit comprising:
a plurality of comparison circuits each including a first terminal to which a plurality of analog signals including a first analog signal and a second analog signal is input and a second terminal connected to a wiring through which a ramp signal is transmitted; and
a control circuit,
wherein the control circuit controls:
a first operation of changing an electric potential of the wiring from a predetermined electric potential to a first electric potential to cause at least one comparison circuit of the plurality of comparison circuits to retain a first offset;
a second operation of, after the first operation, converting the first analog signal into a digital signal using the ramp signal where a change start electric potential of the ramp signal is a second electric potential and a change end electric potential of the ramp signal is a third electric potential, and a range between the second electric potential and the third electric potential is a range which satisfies a condition where the range between the predetermined electric potential and first electric potential is in the range between the second electric potential and the third electric potential;
a third operation of, after the second operation, changing the electric potential of the wiring to an electric potential included in a range of from the predetermined electric potential to the first electric potential; and
a fourth operation of, after the third operation, converting the second analog signal into a digital signal using the ramp signal where another change end electric potential of the ramp signal is a fourth electric potential which is a potential that satisfies a condition where the third electric potential is between the second electric potential and the fourth electric potential.

12. A photoelectric conversion device comprising:
the AD conversion circuit according to claim 11; and
a plurality of pixels each including a photoelectric conversion portion and each configured to output the first analog signal and the second analog signal at respective different times.

13. The photoelectric conversion device according to claim 12, wherein the first analog signal is a noise signal and the second analog signal is a signal that is based on an electric charge generated by the photoelectric conversion portion based on incident light.

14. The photoelectric conversion device according to claim 12,
wherein each of the plurality of pixels includes a plurality of photoelectric conversion portions,
wherein a plurality of microlenses is arranged in such a manner that one microlens is located opposite to the plurality of photoelectric conversion portions of one pixel,
wherein each of the plurality of pixels outputs the second analog signal as a signal that is based on electric charges of some photoelectric conversion portions of the plurality of photoelectric conversion portions,
wherein each of the plurality of pixels outputs a third analog signal as a signal that is based on electric charges of the plurality of photoelectric conversion portions, and wherein the control circuit performs:
a fifth operation of, after the fourth operation, changing the electric potential of the wiring to an electric potential included in a range of from the predetermined electric potential to the first electric potential; and
a sixth operation of, after the fifth operation, converting the third analog signal into a digital signal.

15. The photoelectric conversion device according to claim 12, wherein the control circuit causes each of the plurality of comparison circuits to make a comparison between the second analog signal and a threshold value, and, based on a result of the comparison, changes an amount of change in electrical potential per unit time of a ramp signal for use in the fourth operation.

16. The photoelectric conversion device according to claim 12, wherein the photoelectric conversion device has a structure in which a first substrate on which the plurality of pixels is provided and a second substrate on which the plurality of comparison circuits and the control circuit are provided are stacked in layers.

17. An apparatus comprising the photoelectric conversion device according to claim 12, the apparatus further comprising at least one of:
an optical device located opposite to the photoelectric conversion device;
a control device configured to control the photoelectric conversion device;
a processing device configured to process a signal output from the photoelectric conversion device;
a display device configured to display information obtained by the photoelectric conversion device;
a storage device configured to store information obtained by the photoelectric conversion device; and
a mechanical device configured to operate based on information obtained by the photoelectric conversion device.

18. The driving method for the AD conversion circuit according to claim 1,
wherein the second electric potential is equal to the predetermined electric potential.

19. The driving method for the AD conversion circuit according to claim 1,
wherein, in the fourth operation, the another change start electric potential of the ramp signal is the second electric potential.

20. The driving method for the AD conversion circuit according to claim 18,
wherein, in the fourth operation, the another change start electric potential of the ramp signal is the second electric potential.

21. The driving method for the AD conversion circuit according to claim 1,
wherein the second operation, the third operation, and the fourth operation are performed without resetting a threshold voltage of each of a plurality of comparators.

22. The AD conversion circuit according to claim 11,
wherein the second electric potential is equal to the predetermined electric potential.

23. The AD conversion circuit according to claim 11,
wherein, in the fourth operation, the change start electric potential of the ramp signal is the second electric potential.

24. The AD conversion circuit according to claim 22,
wherein, in the fourth operation, the change start electric potential of the ramp signal is the second electric potential.

25. The AD conversion circuit according to claim 11, wherein the second operation, the third operation, and the fourth operation are performed without resetting a threshold voltage of each of a plurality of comparators.

\* \* \* \* \*